(12) United States Patent
Liu et al.

(10) Patent No.: US 11,678,530 B2
(45) Date of Patent: Jun. 13, 2023

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventors: Wenqu Liu, Beijing (CN); Qi Yao, Beijing (CN); Detian Meng, Beijing (CN); Feng Zhang, Beijing (CN); Zhao Cui, Beijing (CN); Liwen Dong, Beijing (CN); Xiaoxin Song, Beijing (CN); Dongfei Hou, Beijing (CN); Libo Wang, Beijing (CN); Zhijun Lv, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 71 days.

(21) Appl. No.: 17/359,675

(22) Filed: Jun. 28, 2021

(65) Prior Publication Data
US 2022/0223674 A1    Jul. 14, 2022

(30) Foreign Application Priority Data
Jan. 12, 2021   (CN) .......................... 202110035975.8

(51) Int. Cl.
| | |
|---|---|
| *H01L 29/32* | (2006.01) |
| *H10K 59/126* | (2023.01) |
| *H01L 29/786* | (2006.01) |
| *H10K 71/00* | (2023.01) |

(52) U.S. Cl.
CPC ....... *H10K 59/126* (2023.02); *H01L 29/7869* (2013.01); *H01L 29/78672* (2013.01); *H10K 71/00* (2023.02)

(58) Field of Classification Search
CPC . H01L 27/3272; H01L 27/124; H01L 27/768; H01L 27/1225; H01L 27/1218; H01L 29/78672; H01L 29/7869; H01L 29/78621; H01L 29/42384; H01L 29/4908; H01L 51/56; H01L 51/5253; H01L 51/0097
See application file for complete search history.

(56) References Cited

U.S. PATENT DOCUMENTS

2021/0005693 A1*    1/2021   Cho ..................... H01L 27/3262

* cited by examiner

*Primary Examiner* — Nikolay K Yushin
(74) *Attorney, Agent, or Firm* — Ling Wu; Stephen Yang; Ling and Yang Intellectual Property

(57) ABSTRACT

Provided are a display substrate and a preparation method thereof, and a display apparatus. The display substrate includes a substrate, an active structure layer disposed on the substrate, a first source-drain structure layer disposed on a side of the active structure layer away from the substrate, and a second source-drain structure layer disposed on a side of the first source-drain structure layer away from the substrate. The active structure layer includes a first active layer and a second active layer. The first source-drain structure layer includes a first active via and a first source-drain electrode, and the first source-drain electrode is connected to the first active layer through the first active via; and the second source-drain structure layer includes a second active via and a second source-drain electrode, and the second source-drain electrode is connected to the second active layer through the second active via.

18 Claims, 8 Drawing Sheets

DISPLAY SUBSTRATE AND PREPARATION METHOD THEREOF, AND DISPLAY APPARATUS

CROSS-REFERENCE TO RELATED APPLICATION

The present application claims the priority of Chinese Patent Application No. 202110035975.8 filed to the CNIPA on Jan. 12, 2021, the content of which is hereby incorporated by reference.

TECHNICAL FIELD

Embodiments of the present disclosure relate to, but are not limited to, the field of display technology, in particular to a display substrate and a preparation method thereof, and a display apparatus.

BACKGROUND

An organic light-emitting diode (OLED) is an active light-emitting display device, which has advantages of self-emission, wide view, high contrast, low power consumption, and extremely high response speed, etc. With the continuous development of display technology, a flexible display apparatus with the OLED as a light-emitting device and a thin film transistor (TFT) for signal control has become a mainstream product in the display field.

However, an existing OLED display substrate has a problem of poor transistor performance, which directly affects the display effect of an OLED display apparatus.

SUMMARY

The following is a summary of the subject matter described in detail herein. The summary is not intended to limit the protection scope of the claims.

An embodiment of the present disclosure provides a display substrate, which includes a substrate, an active structure layer disposed on the substrate, a first source-drain structure layer disposed on a side of the active structure layer away from the substrate, and a second source-drain structure layer disposed on a side of the first source-drain structure layer away from the substrate.

The active structure layer includes a first active layer and a second active layer.

The first source-drain structure layer includes a first active via and a first source-drain electrode, and the first source-drain electrode is connected to the first active layer through the first active via.

The second source-drain structure layer includes a second active via and a second source-drain electrode, and the second source-drain electrode is connected to the second active layer through the second active via.

In an exemplary embodiment, the active structure layer includes: a first insulating layer disposed on the substrate, a first active layer disposed on a side of the first insulating layer away from the substrate, a second insulating layer covering the first active layer, a first gate electrode disposed on a side of the second insulating layer away from the substrate, a third insulating layer covering the first gate electrode, a light shield layer disposed on a side of the third insulating layer away from the substrate, a fourth insulating layer covering the light shield layer, a second active layer disposed on a side of the fourth insulating layer away from the substrate, a fifth insulating layer disposed on a side of the second active layer away from the substrate, and a second gate electrode disposed on a side of the fifth insulating layer away from the substrate.

In an exemplary embodiment, the first source-drain structure layer includes a sixth insulating layer covering the active structure layer, and a first source electrode and a first drain electrode disposed on a side of the sixth insulating layer away from the substrate; the first active via is formed on the second insulating layer, the third insulating layer, the fourth insulating layer and the sixth insulating layer, and the first source electrode and the first drain electrode are both connected to the first active layer through the first active via.

In an exemplary embodiment, the second source-drain structure layer includes: a seventh insulating layer covering the first source-drain structure layer, a first planarization layer disposed on a side of the seventh insulating layer away from the substrate, and a second source electrode and a second drain electrode disposed on a side of the seventh insulating layer away from the substrate; the second active via is formed on the sixth insulating layer, the seventh insulating layer and the first planarization layer, and the second source electrode and the second drain electrode are both connected to the second active layer through the second active via.

In an exemplary embodiment, the second active via includes a via formed on the seventh insulating layer by one patterning process and a via formed on the first planarization layer and the sixth insulating layer by another patterning process.

In an exemplary embodiment, the second source-drain structure layer further includes a connection electrode connected to the first source-drain electrode through a connection electrode via, and the connection electrode is disposed in a same layer as the second source electrode and the second drain electrode.

In an exemplary embodiment, the display substrate further including a second planarization layer disposed on the second source-drain structure layer and an anode disposed on the second planarization layer, wherein the anode is connected to the connection electrode through an anode via.

In an exemplary embodiment, a material of the first active layer includes low temperature polysilicon, and a material of the second active layer includes oxide; or, a material of the first active layer includes oxide, and a material of the second active layer includes low temperature polysilicon.

An embodiment of the present disclosure further provides a display apparatus which includes any one of the above display substrates.

An embodiment of the present disclosure further provides a preparation method of a display substrate, including:

forming an active structure layer on a substrate, wherein the active structure layer includes a first active layer and a second active layer;

forming a first source-drain structure layer on the active structure layer, wherein the first source-drain structure layer includes a first active via and a first source-drain electrode, and the first source-drain electrode is connected to the first active layer through the first active via; and forming a second source-drain structure layer on the first source-drain structure layer, wherein the second source-drain structure layer includes a second active via and a second source-drain electrode, and the second source-drain electrode is connected to the second active layer through the second active via.

In an example embodiment, the forming an active layer on a substrate includes:

sequentially forming a first insulating layer, the first active layer, a second insulating layer, a first gate electrode, a third insulating layer, a shield layer, a fourth insulating layer and the second active layer on a substrate; and forming a fifth insulating layer disposed on the second active layer and a second gate electrode disposed on the fifth insulating layer.

In an exemplary embodiment, the forming a first source-drain structure layer on the active structure layer includes:

forming a sixth insulating layer covering the active structure layer, wherein the first active via is formed on the second insulating layer, the third insulating layer, the fourth insulating layer and the sixth insulating layer; and forming a first source electrode and a first drain electrode on the sixth insulating layer, and the first source electrode and the first drain electrode are both connected to the first active layer through the first active via.

In an exemplary embodiment, after the forming the first active via, the method further includes: annealing and/or cleaning the first active layer exposed in the first active via.

In an exemplary embodiment, the forming a second source-drain structure layer on the first source-drain structure layer includes:

forming a seventh insulating layer covering the first source-drain structure layer, wherein a second via is formed on the seventh insulating layer, and an insulating layer covering the second active layer is reserved in the second via;

forming a first planarization layer on the seventh insulating layer, forming a fourth via communicated to the second via on the first planarization layer, and etching the insulating layer in the second via to form a second active via; and forming a second source electrode and a second drain electrode on the seventh insulating layer, and the second source electrode and the second drain electrode are both connected to the second active layer through the second active via.

In an exemplary embodiment, the forming a first planarization layer on the seventh insulating layer includes:

coating a planarization thin film on the seventh insulating layer;

forming the first planarization layer through a curing annealing process;

forming the fourth via communicated to the second via through a patterning process; and etching the insulating layer in the second via by using the first planarization layer as a mask to form a second active via that completely exposing the second active layer.

In an exemplary embodiment, a material of the first active layer includes low temperature polysilicon, and a material of the second active layer includes oxide; or, a material of the first active layer includes oxide, and a material of the second active layer includes low temperature polysilicon.

Other aspects will become apparent upon reading and understanding the accompanying drawings and the detailed description.

BRIEF DESCRIPTION OF DRAWINGS

Accompanying drawings are used to provide a further understanding of technical solutions of the present disclosure and form a part of the description to explain the technical solutions of the present disclosure together with embodiments of the present disclosure, which do not constitute any limitation on the technical solutions of the present disclosure. The shape and size of each component in the drawings do not reflect true proportions and only to be used to schematically illustrate contents of the present disclosure.

DETAILED DESCRIPTION

Figure 1:
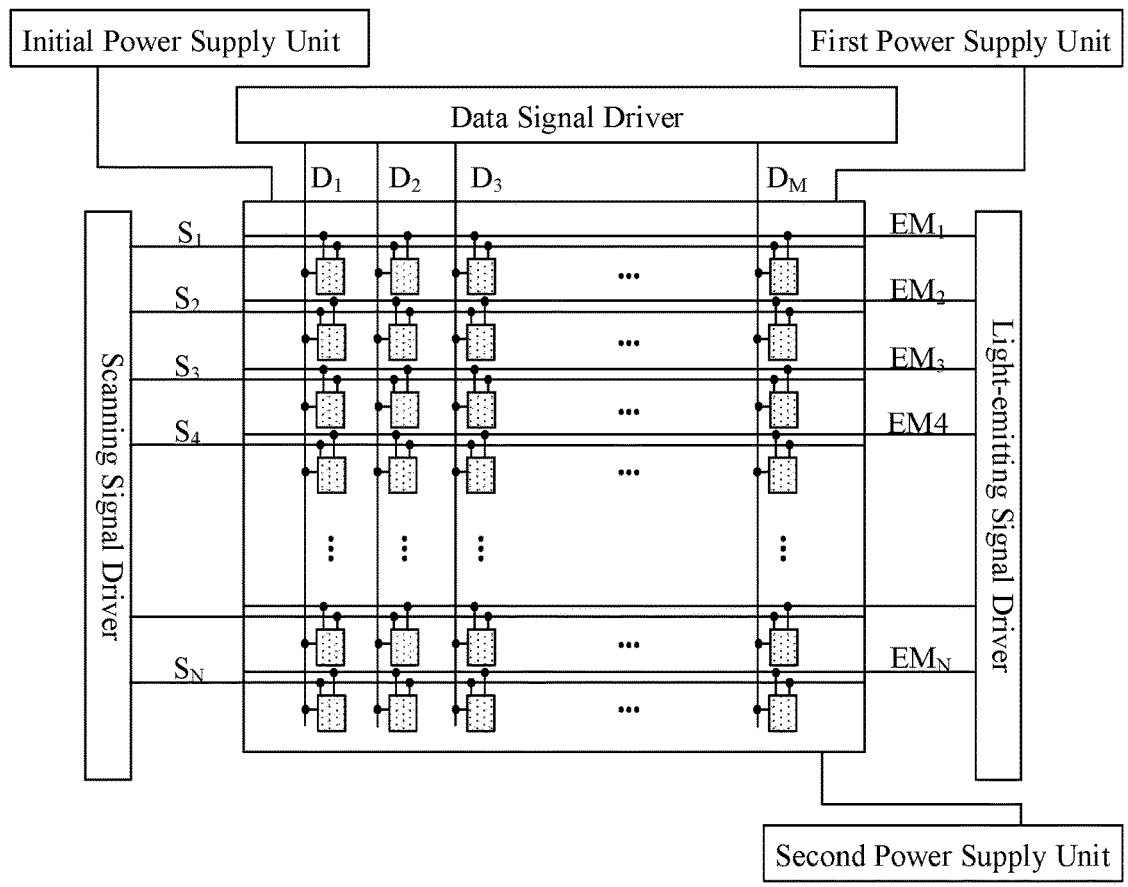
FIG. 1 is a schematic diagram of a structure of a display apparatus.

Hereinafter embodiments of the present disclosure will be described in detail with reference to the accompanying drawings. It should be noted that the embodiments may be implemented in a number of different forms. Those of ordinary skills in the art may readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the accompanying drawings, sizes of various constituent elements and thicknesses and regions of layers are sometimes exaggerated for clarity. Therefore, an implementation of the present disclosure is not necessarily limited to the sizes shown. The shapes and sizes of components in the accompanying drawings do not reflect true proportions. In addition, the drawings schematically show ideal examples, and an implementation of the present disclosure is not limited to the shapes or numerical values shown in the drawings.

The ordinal numbers "first", "second", "third" and the like in this specification are used to avoid confusion between constituent elements, but not to constitute limitations on quantities.

In this description, for sake of convenience, words indicating orientation or positional relations, such as "central", "upper", "lower", "front", "rear", "vertical", "horizontal", "top", "bottom", "inner", "outer" and the like which are used to describe the positional relations between constituent elements with reference to the drawings, the words are only for a purpose of facilitating description of this specification and simplifying the description, rather than indicating or implying that the apparatus or element referred to must have a specific orientation, or must be constructed and operated in a particular orientation, and therefore may not be construed as limitations on the present disclosure. The positional relations between the constituent elements can be appropriately changed according to the directions the constituent element described. Therefore, they are not limited to the wordings in the specification, and may be replaced appropriately according to the situations.

In this specification, terms "install", "connect" and "couple" shall be understood in a broad sense unless otherwise explicitly specified and defined. For example, a connection may be a fixed connection, or may be a detachable connection, or an integrated connection; it may be a mechanical connection, or may be an electrical connection; it may be a direct connection, or may be an indirect connection through middleware, or may be an internal connection between two elements. Those of ordinary skills in the art may understand the specific meanings of the above terms in the present disclosure according to situations.

In this specification, a transistor refers to an element including at least three terminals, namely a gate electrode, a drain electrode and a source electrode. The transistor has a channel region between the drain electrode (a drain electrode terminal, a drain region or a drain electrode) and the source electrode (a source electrode terminal, a source region or a source electrode), and current may flow through the drain electrode, the channel region and the source electrode. It should be noted that in this specification, the channel region refers to a region through which current mainly flows.

In this specification, a first electrode may be a drain electrode and a second electrode may be a source electrode, or the first electrode may be a source electrode and the second electrode may be a drain electrode. Functions of the "source electrode" and the "drain electrode" are sometimes interchangeable in a case where transistors with opposite polarities are used or in a case where the current direction changes during circuit operation. Therefore, in this specification, "source electrode" and "drain electrode" are interchangeable.

In this specification, an "electrical connection" includes a case where constituent elements are connected together through an element with a certain electric action. The "element having a certain electrical action" is not particularly limited as long as it may transmit and receive electrical signals between connected constituent elements. Examples of the "element with a certain electric action" include not only electrodes and wirings, but also switching elements such as transistors, resistors, inductors, capacitors, and other elements having various functions.

In this specification, "parallel" refers to a case where an angle formed by two straight lines is above −10° and below 10°, and thus also includes a case where the angle is above −5° and below 5°. In addition, "perpendicular" refers to a case where an angle formed by two straight lines is above −80° and below 100°, and thus further includes a case where the angle is above −85° and below 95°.

In this specification, "film" and "layer" may be interchangeable. For example, sometimes "conductive layer" may be replaced by "conductive film". Similarly, "insulating film" may sometimes be replaced by "insulator layer".

In the present disclosure, "about" in the present disclosure means that there is no strict limit for a value, and values within an error range during processes and measurement are allowed.

FIG. 1 is a schematic diagram of a structure of a display apparatus. As shown in FIG. 1, an OLED display apparatus may include a scanning signal driver, a data signal driver, a light-emitting signal driver, an OLED display substrate, a first power supply unit, a second power supply unit and an initial power supply unit. In an exemplary embodiment, the OLED display substrate at least includes multiple scanning signal lines ($S_1$ to $S_N$), multiple data signal lines ($D_1$ to $D_M$) and multiple light-emitting signal lines ($EM_1$ to $EM_N$); the scanning signal driver is configured to sequentially supply scanning signals to the multiple scanning signal lines ($S_1$ to $S_N$), the data signal driver is configured to supply data signals to the multiple data signal lines ($D_1$ to $D_M$), and the light-emitting signal driver is configured to sequentially supply light-emitting control signals to the multiple light-emitting signal lines ($EM_1$ to $EM_N$). In an exemplary embodiment, multiple scanning signal lines and multiple light-emitting signal lines extend along a horizontal direction. The display apparatus includes multiple sub-pixels, each sub-pixel includes a pixel drive circuit and a light-emitting device, and the pixel drive circuit of one sub-pixel may be connected to a scanning signal line, a light-emitting control line and a data signal line. A first power supply unit is configured to provide a first power supply voltage to the pixel drive circuit through a first power supply line, a second power supply unit is configured to provide a second power supply voltage to the pixel drive circuit through a second power supply line, and an initial power supply unit is configured to provide an initial power supply voltage to the pixel drive circuit through an initial signal line.

Figure 2:
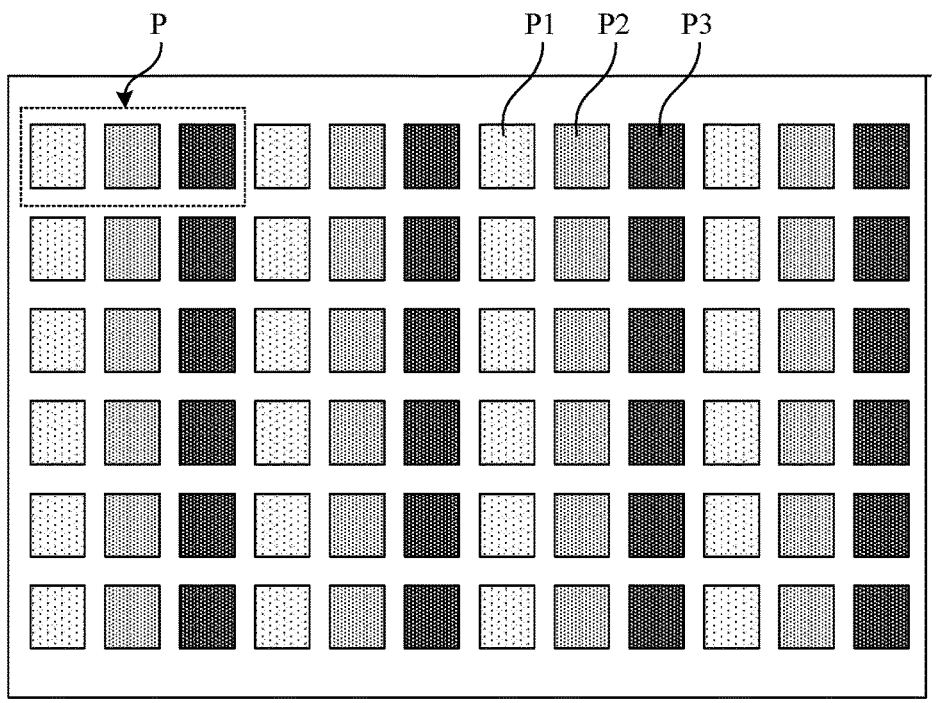
FIG. 2 is a schematic plan view of a structure of a display substrate.

FIG. 2 is a schematic plan view of a structure of a display substrate. As shown in FIG. 2, the display substrate may include multiple pixel units P arranged in a matrix manner. At least one of the multiple pixel units P includes a first light-emitting unit P1 that emits light of a first color, a second light-emitting unit P2 that emits light of a second color and a third light-emitting unit P3 that emits light of a third color. The first light-emitting unit P1, the second light-emitting unit P2 and the third light-emitting unit P3 each include a pixel circuit and a light-emitting device. The pixel drive circuit in the first light-emitting unit P1 is connected to the scanning signal line, the pixel drive circuit in the second light-emitting unit P2 is connected to the data signal line, the pixel drive circuit in the third light-emitting unit P3 is connected to the light-emitting signal line. And the pixel drive circuit is configured to receive the data voltage transmitted by the data signal line under the control of the scanning signal line and the light-emitting signal line, and output a corresponding current to the light-emitting device. The light-emitting device in the first light-emitting unit P1 is connected to the pixel drive circuit of the light-emitting unit where this light-emitting device is located, the light-emitting device in the second light-emitting unit P2 is connected to the pixel drive circuit of the light-emitting unit where this light-emitting device is located, and the light-emitting device in the third light-emitting unit P3 is connected to the pixel drive circuit of the light-emitting unit where this light-emitting device is located. The light-emitting device is configured to emit light of corresponding brightness in response to current output by the pixel drive circuit of the light-emitting unit where this light-emitting device is located.

In an exemplary embodiment, a pixel unit P may include a red light-emitting unit, a green light-emitting unit and a blue light-emitting unit, alternatively, a red light-emitting unit, a green light-emitting unit, a blue light-emitting unit and a white light-emitting unit, which is not limited in the exemplary embodiments of the present disclosure. In an exemplary embodiment, a shape of a light-emitting unit in the pixel unit may be a rectangle, a diamond, a pentagon or a hexagon, etc. When the pixel unit includes three light-emitting units, the three light-emitting units may be arranged in a manner to stand side by side horizontally, in a manner to stand side by side vertically, or in a pyramid manner with two units sitting at the bottom and one unit placed on top. When the pixel unit includes four light-emitting units, the four light-emitting units may be arranged in a manner to stand side by side horizontally, in a manner to stand side by side vertically, or in a manner to form a square, which is not limited in the exemplary embodiments of the present disclosure.

Figure 3:
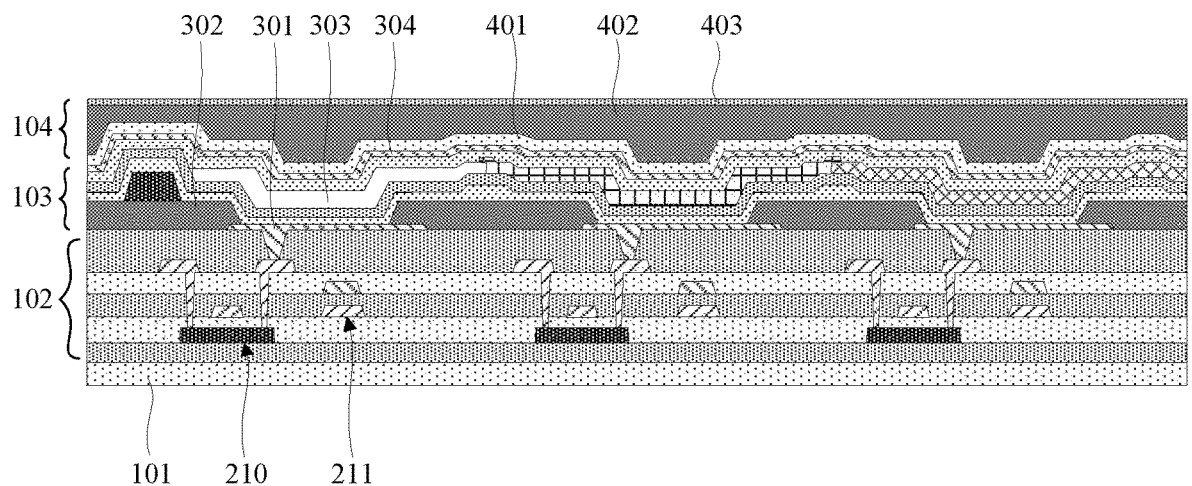
FIG. 3 is a schematic sectional view of a structure of a display substrate.

FIG. 3 is a schematic sectional view of a structure of a display substrate, showing a structure of three sub-pixels in an OLED display substrate. As shown in FIG. 3, on a plane perpendicular to the display substrate, the display substrate may include a drive circuit layer 102 disposed on a substrate 101, a light-emitting device 103 disposed on a side of the drive circuit layer 102 away from the substrate 101, and an encapsulation layer 104 disposed on a side of the light-emitting device 103 away from the substrate 101. In some possible implementations, the display substrate may include other film layers, such as pillar spacers, etc., which is not limited in the exemplary embodiments of the present disclosure.

In an exemplary implementation, the substrate 101 may be a flexible substrate or may be a rigid substrate. A drive circuit layer 102 of each sub-pixel may include multiple transistors and multiple storage capacitors constituting a pixel drive circuit, an example of which is illustrated in FIG. 3 where each sub-pixel includes a transistor 210 and a storage capacitor 211. The light-emitting device 103 may include an anode 301, a pixel define layer 302, an organic light-emitting layer 303 and a cathode 304. The anode 301 is connected to a drain electrode of the driving transistor 210 through a via, the organic light-emitting layer 303 is connected to the anode 301, and the cathode 304 is connected to the organic light-emitting layer 303, The organic light-emitting layer 303 emits light of a corresponding color under the drive of the anode 301 and the cathode 304. An encapsulation layer 104 may include a first encapsulation layer 401, a second encapsulation layer 402 and a third encapsulation layer 403 that are stacked together; the first encapsulation layer 401 and the third encapsulation layer 403 may be made of an inorganic material, and the second encapsulation layer 402 may be made of an organic material; the second encapsulation layer 402 is disposed between the first encapsulation layer 401 and the third encapsulation layer 403 to ensure that external moisture cannot enter into the light-emitting device 103.

Figure 4:
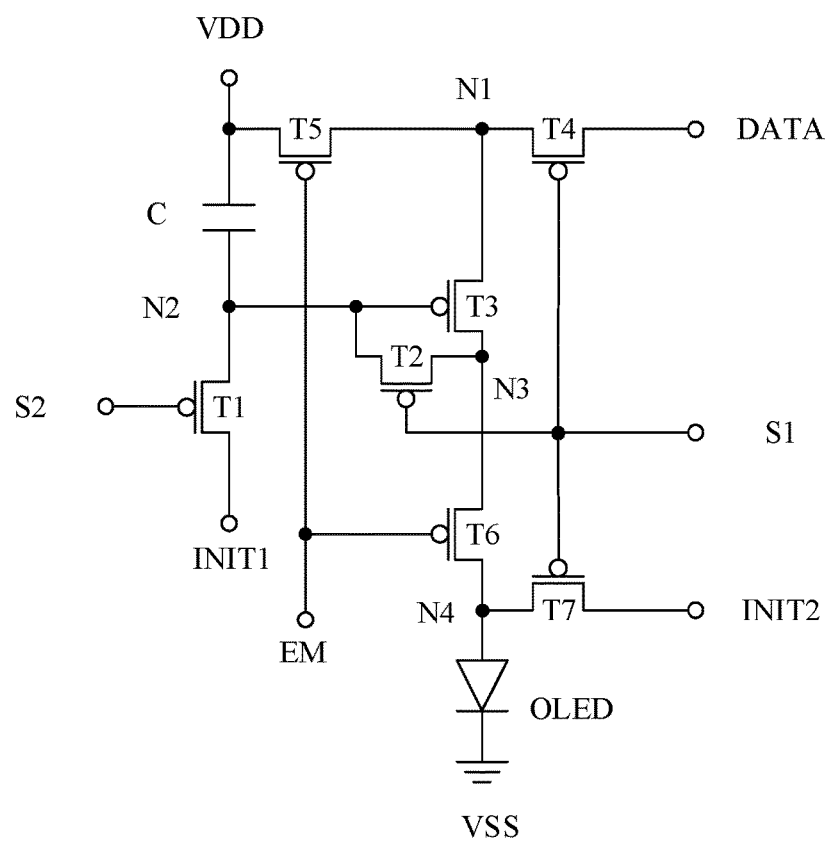
FIG. 4 is a schematic diagram of an equivalent circuit of a pixel drive circuit.

In an exemplary implementation, the pixel drive circuit may have a structure of 3T1C, 4T1C, 5T1C, 5T2C, 6T1C or 7T1C. FIG. 4 is a schematic diagram of an equivalent circuit of a pixel drive circuit. As shown in FIG. 4, the pixel drive circuit may include 7 switching transistors (a first transistor T1 to a seventh transistor T7), 1 storage capacitor C and 8 signal lines (a data signal line DATA, a first scanning signal line S1, a second scanning signal line S2, a first initial signal line INIT1, a second initial signal line INIT2, a first power supply line VSS, a second power supply line VDD and a light-emitting signal line EM).

In an exemplary implementation, a control electrode of a first transistor T1 is connected to the second scanning signal line S2, a first electrode of the first transistor T1 is connected to the first initial signal line INIT1, and a second electrode of the first transistor is connected to a second node N2. A control electrode of a second transistor T2 is connected to the first scanning signal line S1, a first electrode of the second transistor T2 is connected to the second node N2, and a second electrode of the second transistor T2 is connected to a third node N3. A control electrode of a third transistor T3 is connected to the second node N2, a first electrode of the third transistor T3 is connected to a first node N1, and a second electrode of the third transistor T3 is connected to the third node N3. A control electrode of a fourth transistor T4 is connected to the first scanning signal line S1, a first electrode of the fourth transistor T4 is connected to the data signal line DATA, and a second electrode of the fourth transistor T4 is connected to the first node N1. A control electrode of a fifth transistor T5 is connected to the light-emitting signal line EM, a first electrode of the fifth transistor T5 is connected to the second power supply line VDD, and a second electrode of the fifth transistor T5 is connected to the first node N1. A control electrode of the sixth transistor T6 is connected to the light-emitting signal line EM, a first electrode of the sixth transistor T6 is connected to the third node N3, and a second electrode of the sixth transistor T6 is connected to a first electrode of the light-emitting device. A control electrode of the seventh transistor T7 is connected to the first scanning signal line S1, a first electrode of the seventh transistor T7 is connected to the second initial signal line INIT2, and a second electrode of the seventh transistor T7 is connected to the first electrode of the light-emitting device. A first terminal of the storage capacitor C is connected to the second power supply line VDD, and a second terminal of the storage capacitor C is connected to the second node N2.

In an exemplary implementation, a second electrode of the light-emitting device is connected to the first power supply line VSS; a signal of the first power supply line VSS is a low level signal, and a signal of the second power supply line VDD is a high level signal that is continuously supplied. The first scanning signal line S1 is a scanning signal line for a pixel drive circuit of a current display row, and a second scanning signal line S2 is a scanning signal line for a pixel drive circuit of a previous display row; that is, for a n-th display row, a first scanning signal line S1 is S(n), a second scanning signal line S2 is S(n−1), a second scanning signal line S2 of the current display row and the first scanning signal line S1 for the pixel drive circuit of the previous display row are the same signal line, which may reduce the signal lines of the display panel and achieve a narrow bezel of the display panel.

In an exemplary implementation, the first transistor T1 to the seventh transistor T7 may be P-type transistors or may be N-type transistors. Adopting transistors of the same type in the pixel drive circuit may simplify a process flow, reduce difficulty in a manufacturing process of the display panel, and improve a product yield. In some possible implementations, the first transistor T1 to the seventh transistor T7 may include P-type transistors and N-type transistors.

In an exemplary embodiment, the first transistor T1 to the seventh transistors T7 may adopt low temperature polysilicon thin film transistors, or oxide thin film transistors, or low temperature polysilicon thin film transistors and oxide thin film transistors. A active layer of a low temperature polysilicon (LTPS) thin film transistor adopts low temperature polysilicon, and an active layer of an oxide thin film transistor adopts oxide. Low temperature polysilicon thin film transistors have the advantages of high mobility and fast charging, while oxide thin film transistors have the advantages of low leakage current. In an exemplary embodiment, the low temperature polysilicon thin film transistor and the oxide thin film transistor may be integrated on one display substrate to form a low temperature polycrystalline oxide (LTPO) display substrate, and the advantages of both may be utilized to achieve high resolution (PPI), low frequency drive, which reduces the power consumption and improves the display quality.

Exemplary embodiments of the present disclosure provide a display substrate, which includes a substrate, an active structure layer disposed on the substrate, a first source-drain structure layer disposed on a side of the active structure layer away from the substrate, and a second source-drain structure layer disposed on a side of the first source-drain structure layer away from the substrate. The active structure layer includes a first active layer and a second active layer. The first source-drain structure layer includes a first active via and a first source-drain electrode, and the first source-drain electrode is connected to the first active layer through the first active via; and the second source-drain structure layer includes a second active via and a second source-drain electrode, and the second source-drain electrode is connected to the second active layer through the second active via.

In an exemplary embodiment, the active structure layer includes: a first insulating layer disposed on the substrate, a first active layer disposed on a side of the first insulating layer away from the substrate, a second insulating layer covering the first active layer, a first gate electrode disposed on a side of the second insulating layer away from the substrate, a third insulating layer covering the first gate electrode, a light shield layer disposed on a side of the third insulating layer away from the substrate, a fourth insulating layer covering the light shield layer, a second active layer disposed on a side of the fourth insulating layer away from the substrate, a fifth insulating layer disposed on a side of the second active layer away from the substrate, and a second gate electrode disposed on a side of the fifth insulating layer away from the substrate.

In an exemplary embodiment, the first source-drain structure layer includes a sixth insulating layer covering the active structure layer, and a first source electrode and a first drain electrode disposed on a side of the sixth insulating layer away from the substrate; the first active via is formed on the second insulating layer, the third insulating layer, the fourth insulating layer and the sixth insulating layer, and the first source electrode and the first drain electrode are both connected to the first active layer through the first active via.

In an exemplary embodiment, the second source-drain structure layer includes: a seventh insulating layer covering the first source-drain structure layer, a first planarization layer disposed on a side of the seventh insulating layer away from the substrate, and a second source electrode and a second drain electrode disposed on a side of the seventh insulating layer away from the substrate; a second active via is formed on the sixth insulating layer, the seventh insulating layer and the first planarization layer, and the second source electrode and the second drain electrode are both connected to the second active layer through the second active via.

In an exemplary embodiment, the second active via includes a via formed on the seventh insulating layer by one patterning process and a via formed on the first planarization layer and the sixth insulating layer by another patterning process.

In an exemplary embodiment, a material of the first active layer includes low temperature polysilicon, and a material of the second active layer includes oxide; or, a material of the first active layer includes oxide, and a material of the second active layer includes low temperature polysilicon.

Figure 5:
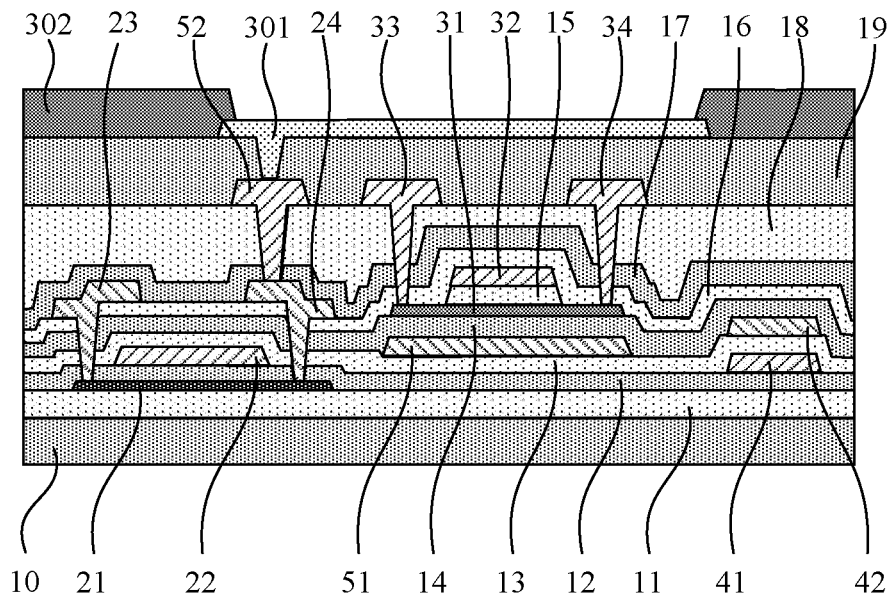
FIG. 5 is a schematic diagram of a structure of a display substrate according to an exemplary embodiment of the present disclosure.

FIG. 5 is a schematic diagram of a structure of a display substrate according to an exemplary embodiment of the present disclosure. As shown in FIG. 5, the display substrate may include a substrate 10, an active structure layer disposed on the substrate 10, a first source-drain structure layer disposed on the active structure layer, a second source-drain structure layer disposed on the first source-drain structure layer, and a light-emitting structure layer disposed on the second source-drain structure layer.

In an exemplary embodiment, the active structure layer may include: a first insulating layer 11 disposed on the substrate 10; a first semiconductor layer disposed on the first insulating layer 11, the first semiconductor layer at least includes a first active layer 21; a second insulating layer 12 covering the first semiconductor layer; a first metal layer disposed on the second insulating layer 12, the first metal layer at least includes a first gate electrode 22 and a first capacitor electrode 41; a third insulating layer 13 covering the first metal layer; a second metal layer disposed on the third insulating layer 13, the second metal layer at least includes a second capacitor electrode 42 and a shield layer 51; a fourth insulating layer 14 covering the second metal layer; a second semiconductor layer disposed on the fourth insulating layer 14, the second semiconductor layer at least includes a second active layer 31; a fifth insulating layer 15 disposed on the second active layer 31; a third metal layer disposed on the fifth insulating layer 15, the third metal layer at least includes a second gate electrode 32.

In an exemplary embodiment, the first source-drain structure layer may include a sixth insulating layer 16 covering the third metal layer, and a fourth metal layer disposed on the sixth insulating layer 16, the fourth metal layer at least includes a first source electrode 23 and a first drain electrode 24. Two first active vias are formed on the second insulating layer 12, the third insulating layer 13, the fourth insulating layer 14 and the sixth insulating layer 16, the two first active vias expose a surface of the first active layer 21 away from the substrate. The first source electrode 23 and the first drain electrode 24 are connected to the first active layer 21 through the two first active vias.

In an exemplary embodiment, the second source-drain structure layer may include a seventh insulating layer 17 covering the fourth metal layer, a first planarization layer 18 covering the seventh insulating layer 17, and a fifth metal layer disposed on the first planarization layer 18, the fifth metal layer at least includes a second source electrode 33, a second drain electrode 34, and a connection electrode 52. The sixth insulating layer 16, the seventh insulating layer 17 and the first planarization layer 18 are provided with two second active vias, which expose a surface of the second active layer 31 away from the substrate. The second source electrode 33 and the second drain electrode 34 are connected to the second active layer 31 through the two second active vias. The seventh insulating layer 17 and the first planarization layer 18 are provided with an anode via, which exposes a surface of the first drain electrode 24 away from the substrate, and the connection electrode 52 is connected to the first drain electrode 24 through the connection electrode via.

In an exemplary embodiment, the light-emitting structure layer may include a second planarization layer 19 covering the fifth metal layer, an anode 301 disposed on the second planarization layer 19, a pixel define layer 302 disposed on the anode 301, an organic light-emitting layer (not shown) connected to the anode 301, and a cathode (not shown) connected to the organic light-emitting layer. The second planarization layer 19 is provided with an anode via, which exposes a surface of the connection electrode 52 away from the substrate, and the anode 301 is connected to the connection electrode 52 through the anode via. The pixel define layer 302 is provided with a pixel opening which exposes a surface of the anode 301, and the organic light-emitting layer is connected to the anode 301 through the pixel opening.

The following is an exemplary explanation through a preparation process of the display substrate. The "patterning process" mentioned in the exemplary embodiments of the present disclosure include processes, such as photoresist coating, mask exposure, development, etching and photoresist stripping for metal materials, inorganic materials or transparent conductive materials, and includes organic material coating, mask exposure and development for organic materials. Deposition may be implemented by any one or more of sputtering, the evaporation and chemical vapor deposition, coating may be implemented by any one or more of spraying coating, spin coating and ink-jet printing, and the etching may be implemented by any one or more of dry etching and wet etching, and these are not limited in the exemplary embodiments of the present disclosure. A "thin film" refers to a layer of thin film manufactured by a certain material on a substrate by using deposition, coating or another process. If the "thin film" does not need a patterning process during the whole manufacturing process, the "thin film" can also be referred to as a "layer". If the "thin film" needs a patterning process in the whole manufacturing process, it is referred to as a "thin film" before the patterning process and as a "layer" after the patterning process. The "layer" after the patterning process contains at least one "pattern". In the exemplary embodiments of the present disclosure, "A and B are disposed on the same layer" indicates that A and B are formed by the same patterning process, and a "thickness" of the thin film layer is the dimension of the thin film layer in a direction perpendicular to the display substrate. Herein, "an orthographic projection of A including an orthographic projection of B" or "an orthographic projection of B is located within the range of an orthographic projection of A" means that the boundary of the orthographic projection of B falls within the range of the boundary of the orthographic projection of A, or the boundary of the orthographic projection of A overlaps with the boundary of the orthographic projection of B.

FIG. 6 to FIG. 18 are schematic diagrams showing a preparation process of a display substrate. In an exemplary embodiment, a display substrate may include a display region 100 and a bonding region 200 located on a side of the display region 100, and a driving structure layer of the display region 100 and a bonding structure layer of the bonding region 200 are prepared synchronously. In an exemplary embodiment, the preparing process of the display substrate may include the following operations.

(1) A substrate 10 is prepared on a glass carrier plate 1. In an exemplary embodiment of the present disclosure, the substrate 10 may include a first flexible material layer, a first inorganic material layer, a semiconductor layer, a second flexible material layer and a second inorganic material layer which are stacked on the glass carrier plate 1. Materials of the first flexible material layer and the second flexible material layer may be polyimide (PI), polyethylene terephthalate (PET) or polymer soft thin film after surface treatment, and materials of the first inorganic material layer and the second inorganic material layer may be silicon nitride (SiNx) or silicon oxide (SiOx) to improve the water and oxygen resistance capability of the substrate. The first inorganic material layer and the second inorganic material layers may be referred to as barrier layers, and amorphous silicon (a-si) may be used as the material of the semiconductor layer. In an exemplary embodiment, taking a laminated structure PI1/Barrier1/a-si/PI2/Barrier 2 as an example, the preparation process may include: coating a layer of polyimide on the glass carrier plate 1, and forming a first flexible (PI1) layer after curing the layer of polyimide to form a thin film; subsequently, depositing a layer of barrier thin film on the first flexible layer to form a first barrier (Barrier 1) layer covering the first flexible layer; then depositing a layer of amorphous silicon thin film on the first barrier layer to form an amorphous silicon (a-si) layer covering the first barrier layer; then coating a layer of polyimide on the amorphous silicon layer, and forming a second flexible (PI2) layer after curing the layer of polyimide to form a thin film; then depositing a layer of barrier thin film on the second flexible layer to form a second barrier (Barrier 2) layer covering the second flexible layer, to complete the preparation of the substrate 10.

Figure 6:
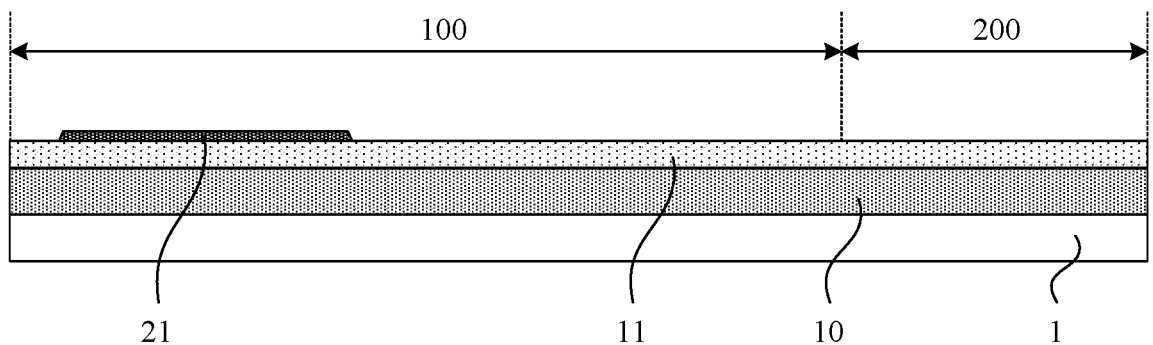
FIG. 6 is a schematic diagram of a display substrate after a pattern of a first active layer is formed according to an exemplary embodiment of the present disclosure.

(2) A pattern of a first semiconductor layer is formed. In an exemplary embodiment, forming of the pattern of the first semiconductor layer may include: sequentially depositing a first insulating thin film and a first semiconductor thin film on the substrate 10, and patterning the first semiconductor thin film through a patterning process to form a first insulating layer 11 covering the entire substrate 10 and the pattern of the first semiconductor layer disposed on the first insulating layer 11. The pattern of the first semiconductor layer is formed in the display region 100, and the pattern of the first semiconductor layer at least includes the first active layer 21, as shown in FIG. 6. In an exemplary embodiment, the first insulating layer may prevent substances in the substrate from diffusing into other thin film structures in a subsequent process, which degrades the quality of the display substrate.

In an exemplary embodiment, this patterning process is referred to as a first patterning process. After this patterning process, the bonding structure layer of the bonding region 200 includes the substrate 10 disposed on the glass carrier plate 1 and the first insulating layer 11 disposed on the substrate 10.

In an exemplary embodiment, the patterning of the first semiconductor thin film through the patterning process may include: forming an amorphous silicon (a-si) thin film on the first insulating thin film, dehydrogenating the amorphous silicon thin film, and crystallizing the dehydrogenated amorphous silicon thin film to form a poly-silicon thin film. Subsequently, the polysilicon thin film is patterned to form a pattern of the first semiconductor layer. Since a large amount of hydrogen existing in amorphous silicon tend to cause defects in subsequent processes, it is necessary to perform the dehydrogenating process after forming amorphous silicon thin films. A crystallization process is a process for crystallizing amorphous silicon to form polysilicon (p-si). For example, the crystallization process may be performed by an excimer laser annealing (ELA) process. Since the annealing treatment for forming polysilicon may damage the oxide, the preparation of the first active layer of low temperature polysilicon is before the preparation of the second active layer of metal oxide.

Figure 7:
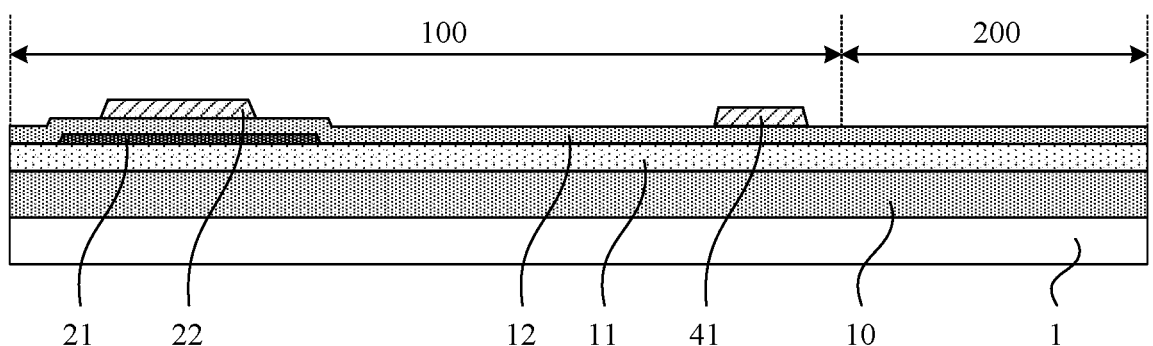
FIG. 7 is a schematic diagram of a display substrate after a pattern of a first metal layer is formed according to an exemplary embodiment of the present disclosure.

(3) A pattern of a first metal layer is formed. In an exemplary embodiment, forming of the pattern of the first metal layer may include: sequentially depositing a second insulating thin film and a first metal thin film on the substrate on which the aforementioned patterns are formed, and patterning the first metal thin film through a patterning process to form a second insulating layer 12 covering the pattern of the first semiconductor layer and a pattern of the first metal layer disposed on the second insulating layer 12. The pattern of the first metal layer is formed in the display region 100, and the pattern of the first metal layer includes at least a first gate electrode 22 and a first capacitor electrode 41, as shown in FIG. 7.

In an exemplary embodiment, this patterning process is referred to as a second patterning process. After this patterning process, the bonding structure layer of the bonding region 200 includes the substrate 10 disposed on the glass carrier plate 1, the first insulating layer 11 disposed on the substrate 10, and the second insulating layer 12 disposed on the first insulating layer 11.

Figure 8:
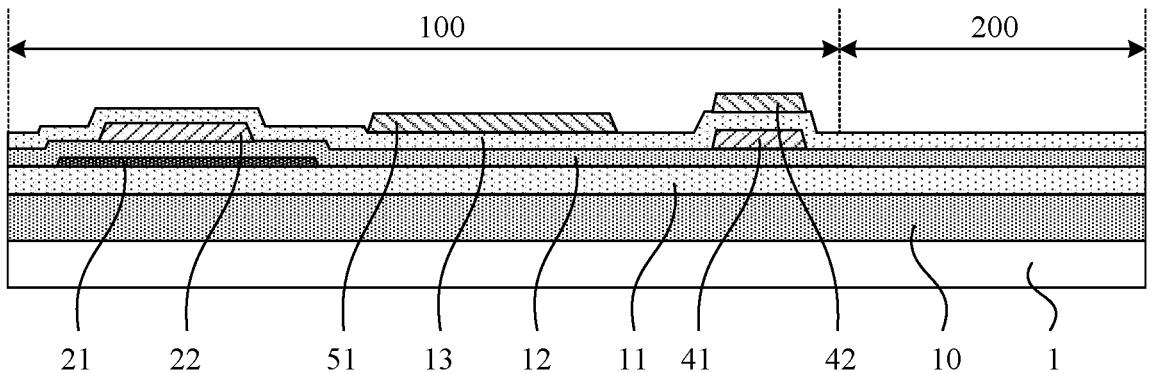
FIG. 8 is a schematic diagram of a display substrate after a pattern of a second metal layer is formed according to an exemplary embodiment of the present disclosure.

(4) A pattern of a second metal layer is formed. In an exemplary embodiment, forming of the pattern of the second metal layer may include: sequentially depositing a third insulating thin film and a second metal thin film on the substrate on which the aforementioned patterns are formed, and patterning the second metal thin film through a patterning process to form a third insulating layer 13 covering the pattern of the first metal layer, and a pattern of the second metal layer disposed on the third insulating layer 13. The pattern of the second metal layer is formed in the display region 100, and the pattern of the second metal layer at least includes a second capacitor electrodes 42 and a shield layer 51, as shown in FIG. 8. In an exemplary embodiment, a position of the second capacitor electrode 42 corresponds to a position of the first capacitor electrode 41, that is, an orthographic projection of the second capacitor electrode 42 on the substrate overlaps with an orthographic projection of the first capacitor electrode 41 on the substrate.

In an exemplary embodiment, this patterning process is referred to as the third patterning process. After this patterning process, the bonding structure layer of the bonding region 200 includes a substrate 10 disposed on the glass carrier plate 1, a first insulating layer 11 and a first composite insulating layer sequentially stacked on the substrate 10. The first composite insulating layer includes a second insulating layer 12 and a third insulating layer 13.

Figure 9:
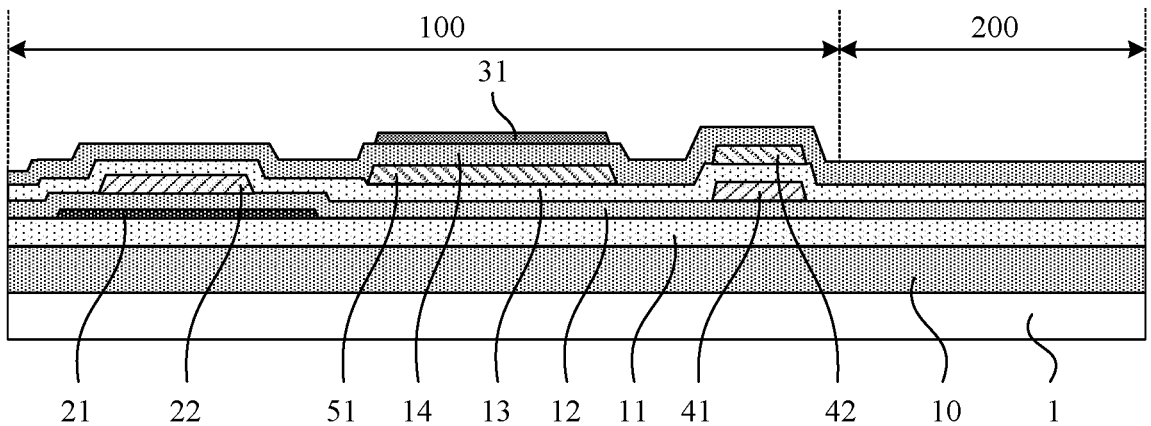
FIG. 9 is a schematic diagram of a display substrate after a pattern of a second active layer is formed according to an exemplary embodiment of the present disclosure.

(5) A pattern of a second active layer is formed. In an exemplary embodiment, forming of the pattern of the second active layer may include: sequentially depositing a fourth insulating thin film and a second semiconductor thin film on the substrate on which the aforementioned pattern is formed, and patterning the second semiconductor thin film through a patterning process to form a fourth insulating layer 14 covering the entire substrate 10 and a pattern of the second semiconductor layer disposed on the fourth insulating layer 14. The pattern of the second semiconductor layer is formed in the display region 100 and at least includes a second active layer 31, as shown in FIG. 9. In an exemplary embodiment, a position of the second active layer 31 corresponds to a position of the shield layer 51, that is, an orthographic projection of the second active layer 31 on the substrate is within the range of an orthographic projection of the shield layer 51 on the substrate. In an exemplary embodiment, this patterning process is referred to as a fourth patterning process. After this patterning process, the bonding structure layer of the bonding region 200 includes the substrate 10 disposed on the glass carrier plate 1, and the first insulating layer 11, a first composite insulating layer and the fourth insulating layer 14 which are sequentially stacked on the substrate 10.

In an exemplary embodiment, the second semiconductor thin film may be made of an oxide, which may be any one or more of indium gallium zinc oxide (InGaZnO), indium gallium zinc oxynitride (InGaZnON), zinc oxide (ZnO), zinc oxynitride (ZnON), zinc tin oxide (ZnSnO), cadmium tin oxide (CdSnO), gallium tin oxide (GaSnO), titanium tin oxide (TiSnO), copper aluminum oxide (CuAlO), strontium copper oxide (SrCuO), lanthanum copper oxysulfide (LaCuOS), gallium nitride (GaN), indium gallium nitride (InGaN), aluminum gallium nitride (AlGaN) and indium gallium aluminum nitride (InGaAlN). In some possible implementations, the second semiconductor thin film may be made of indium gallium zinc oxide (IGZO), which has higher electron mobility than amorphous silicon.

In an exemplary embodiment, a distance between the second active layer 31 and the substrate is greater than a distance between the first active layer 21 and the substrate.

In an exemplary embodiment, the fourth insulating layer 14 may have a thickness of about 2500 Å to 3500 Å, and the second active layer 31 may have a thickness of about 300 Å to 500 Å. In some possible implementations, the fourth insulating layer 14 may have a thickness of about 2800 Å to 3200 Å, and the second active layer 31 may have a thickness of about 350 Å to 450 Å.

Figure 10:
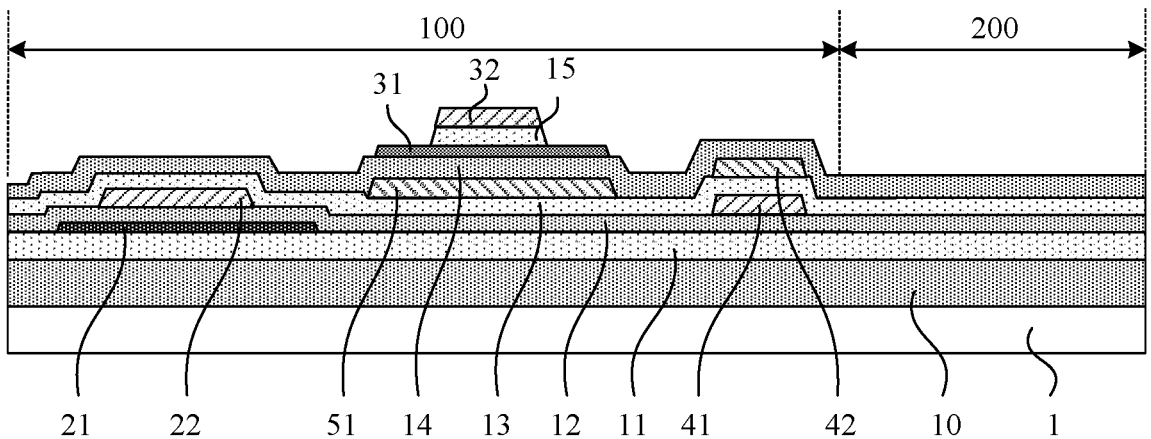
FIG. 10 is a schematic diagram of a display substrate after a pattern of a third metal layer is formed according to an exemplary embodiment of the present disclosure.

(6) A pattern of a third metal layer is formed. In an exemplary embodiment, forming of the pattern of the third metal layer may include: sequentially depositing a fifth insulating thin film and a third metal thin film on the substrate on which the aforementioned patterns are formed, patterning the third metal thin film and the fifth insulating thin film through a patterning process to form a fifth insulating layer 15 disposed on the second active layer 31 and a third metal layer pattern disposed on the fifth insulating layer 15. The fifth insulating layer 15 and a pattern of the third metal layer are formed in the display region 100, and the pattern of the third metal layer at least includes the second gate electrode 32, as shown in FIG. 10. In an exemplary embodiment, an orthographic projection of the second gate electrode 32 on the substrate substantially overlaps with an orthographic projection of the fifth insulating layer 15 on the substrate.

In an exemplary embodiment, this patterning process is referred to as a fifth patterning process. After this patterning process, the bonding structure layer of the bonding region 200 includes a substrate 10 disposed on the glass carrier plate 1, and the first insulating layer 11, the first composite insulating layer and the fourth insulating layer 14 which are sequentially stacked on the substrate 10.

In an exemplary embodiment, the third metal layer may have a thickness of about 2000 Å to 3000 Å. In some possible implementations, the third metal layer may have a thickness of about 2300 Å to 2700 Å.

Figure 11:
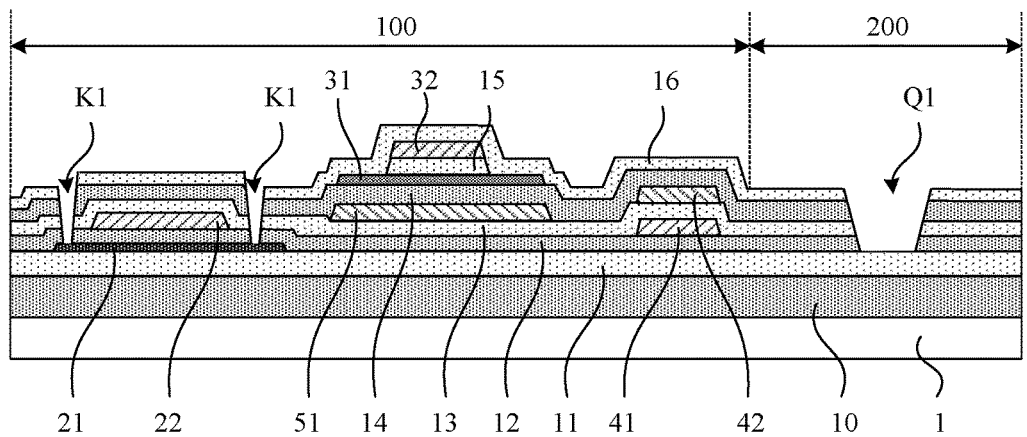
FIG. 11 is a schematic diagram of a display substrate after a pattern of a first active via is formed according to an exemplary embodiment of the present disclosure.

(7) A pattern of a sixth insulating layer is formed. In an exemplary embodiment, forming of the pattern of the sixth insulating layer may include: depositing a sixth insulating thin film on the substrate on which the aforementioned patterns are formed, and patterning the sixth insulating thin film through a patterning process to form a sixth insulating layer 16 covering the pattern of the third metal layer, and the sixth insulating layer 16 is provide with a first via K1 and a first groove Q1, as shown in FIG. 11. In an exemplary embodiment, two first vias K1 are formed in the display region 100 at two ends of the first active layer 21. The sixth insulating layer 16, the fourth insulating layer 14, the third insulating layer 13 and the second insulating layer 12 in the first vias K1 are etched away, exposing the surfaces at two ends of the second active layer 31, and the first vias K1 serve as the first active vias. In an exemplary embodiment, the first groove Q1 is formed in the bonding region 200, and the sixth insulating layer 16, the fourth insulating layer 14, the third insulating layer 13, and the second insulating layer 12 in the first groove Q1 are etched away, thereby exposing the surface of the first insulating layer 11.

In an exemplary embodiment, this patterning process is referred to as a sixth patterning process. After this patterning process, the bonding structure layer of the bonding region 200 includes the substrate 10 disposed on the glass carrier plate 1, and the first insulating layer 11, the first composite insulating layer, the fourth insulating layer 14 and the sixth insulating layer 16 which are sequentially stacked on the substrate 10. The first groove Q1 is formed on the first composite insulating layer, the fourth insulating layer 14 and the sixth insulating layer 16.

In an exemplary embodiment, the sixth insulating layer may have a thickness of about 4500 Å to 6500 Å. In some possible implementations, the sixth insulating layer may have a thickness of about 5000 Å to 6000 Å.

In an exemplary embodiment, the bonding region may include a first fanout region, a bending region, a second fanout region, a driver chip region and a bonding pin region. The first fanout region may be provided with a first power supply line, a second power supply line and multiple data transmission lines, wherein multiple data transmission lines are configured to connect data lines of the display region in a fanout way, the first power supply line (VDD) is configured to connect high-level power supply lines of the display region 100, and the second power supply line (VSS) is configured to connect low-level power supply lines of an edge region. The second fanout region may be provided with multiple data transmission lines led out in a fanout way. The driver chip region may be provided with a source driver circuit (Driver IC), which is configured to be connected with multiple data transmission lines of the second fanout region. The bonding pin region may be provided with multiple pins, which are configured to be connected to a flexible printed circuit board (FPC). The first groove Q1 formed in the bonding region 200 is located in the bending region in the bonding region 200 to reduce the thickness of the bending region and bend the bonding region 200 to the back of the display substrate to reduce the bezel. In an exemplary embodiment, the process of forming the first groove Q1 this time is referred to as etch bending A mask (EBA MASK).

Figure 12:
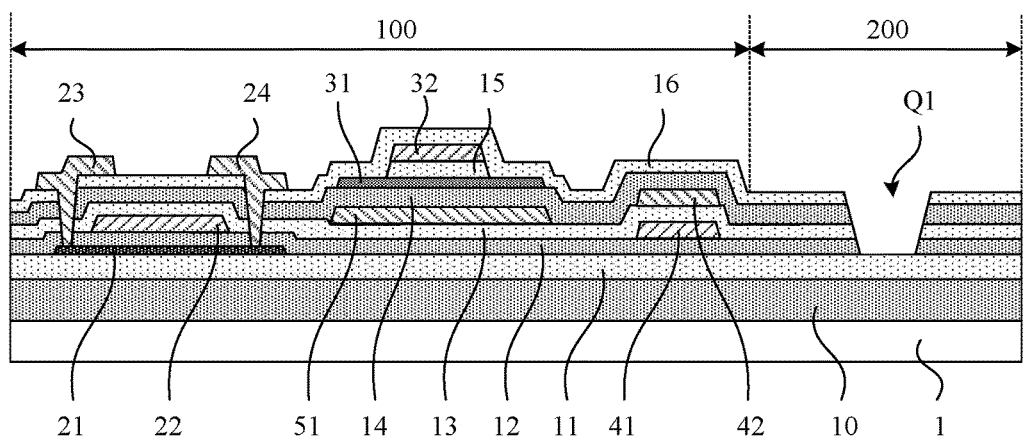
FIG. 12 is a schematic diagram of a display substrate after a pattern of a fourth metal layer is formed according to an exemplary embodiment of the present disclosure.

(8) A pattern of a fourth metal layer is formed. In an exemplary embodiment, forming of the pattern of the fourth metal layer may include: depositing a fourth metal thin film on the substrate on which the aforementioned patterns are formed, patterning the fourth metal thin film through a patterning process to form the pattern of the fourth metal layer on the sixth insulating layer 16. The pattern of the fourth metal layer is formed in the display region 100 and at least includes the first source electrode 23 and the first drain electrode 24. Both the first source electrode 23 and the first drain electrode 24 are connected to the first active layer 21 through the first via K1, as shown in FIG. 12. In an exemplary embodiment, the first source electrode 23 and the first drain electrode 24 are referred to as a first source-drain electrode. The first source electrode 23 and the first drain electrode 24 both overlap with a surface of the first active layer 21 away from the substrate to form a just contact connection.

In an exemplary embodiment, after the first via is formed and before the first source-drain electrode is formed, a process of annealing the first active layer at a high temperature (about 450° C.) and a process of cleaning the first active layer may also be included to reduce contact resistance and improve connection quality.

According to the above preparation process, it can be seen that in an exemplary embodiment of the present disclosure, the first source-drain electrode is formed after a first vias is formed, so that the first source-drain electrode is connected to the first active layer through the first via, while there is no via at the position of the second active layer, and the second active layer is completely covered by the sixth insulating layer. Since the second active layer is completely covered, the high-temperature annealing process and cleaning process of the first active layer will not affect the second active layer. The high-temperature annealing process will not make the second active layer deoxidized and conductive, and the cleaning process will not damage the second active layer, thus effectively avoiding the performance deterioration of the second transistor.

In an exemplary embodiment, this patterning process is referred to as the seventh patterning process. After this patterning process, the bonding structure layer of the bonding region 200 has the same structure as that after the sixth patterning process.

In an exemplary embodiment, the fourth metal layer may have a thickness of about 7000 Å to 9000 Å. In some possible implementations, the fourth metal layer may have a thickness of about 7200 Å.

Figure 13:
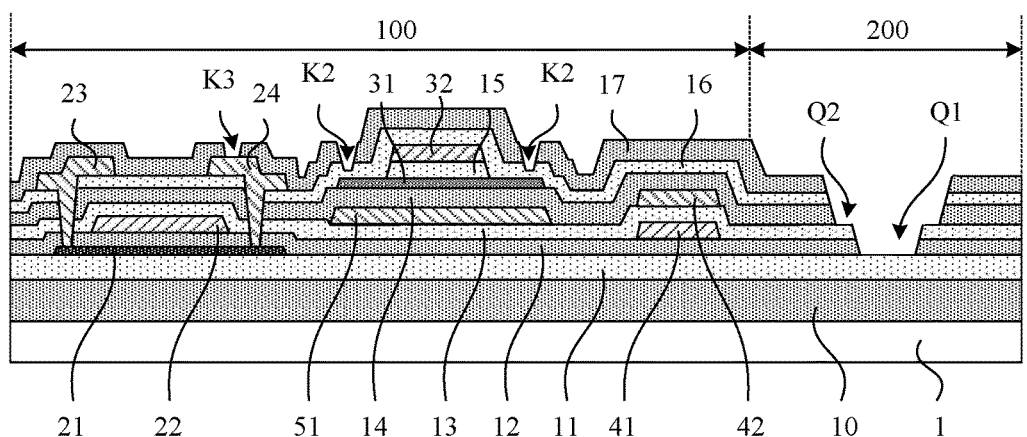
FIG. 13 is a schematic diagram of a display substrate after a pattern of a seventh insulating layer is formed according to an exemplary embodiment of the present disclosure.

(9) A pattern of a seventh insulating layer is formed. In an exemplary embodiment, forming of the pattern of the seventh insulating layer may include: depositing a seventh insulating thin film on the substrate on which the aforementioned patterns are formed, and patterning the seventh insulating thin film through a patterning process to form a seventh insulating layer 17 covering the pattern of the fourth metal layer, and the seventh insulating layer 17 is provided with a second via K2, a third via K3 and a second groove Q2, as shown in FIG. 13.

In an exemplary embodiment, two second vias K2 are formed at positions of two ends of the second active layer 31 in the display region 100. The seventh insulating layer 17 in the second via K2 is etched away. A Part of the thickness of the sixth insulating layer 16 is etched away, but a part of the thickness of the sixth insulating layer 16 remains, to form a semi-open structure. An insulating layer in the second via K2 of the semi-opening structure covers the surface of the second active layer 31, that is, the semi-open structure does not expose the surface of the second active layer 31. That is, the second via K2 is a semi-open via, rather than a fully open via.

In an exemplary embodiment, the third via K3 is formed at a position of the first drain electrode 24 in the display region 100, and the seventh insulating layer 17 in the third via K3 is etched away, exposing the surface of the first drain electrode 24.

In an exemplary embodiment, the second groove Q2 is formed at a position of the first groove Q1 in the bonding region 200, and the seventh insulating layer 17, the sixth insulating layer 16 and the fourth insulating layer 14 in the second groove Q2 are etched away, to expose the first groove Q1, and the first groove Q1 and the second groove Q2 together form a stepped groove structure. In an exemplary embodiment, an orthographic projection of the second groove Q2 on the substrate includes an orthographic projection of the first groove Q1 on the substrate, that is, the second groove Q2 exposes the first groove Q1 and the first groove Q1 exposes the first insulating layer 11. In an exemplary embodiment, the process of forming the second groove Q2 this time is referred to as etch bending B mask (EBB MASK).

In an exemplary embodiment, this patterning process is referred to as an eighth patterning process. After this patterning process, the bonding structure layer of the bonding region 200 includes the substrate 10 disposed on the glass carrier plate 1, and the first insulating layer 11, the first composite insulating layer and a second composite insulating layer which are sequentially stacked on the substrate 10. The first groove Q1 is formed on the first composite insulating layer, and the second groove Q2 is formed on the second composite insulating layer. The first composite insulating layer includes the second insulating layer 12 and the third insulating layer 13 which are stacked, and the second composite insulating layer includes the fourth insulating layer 14, the sixth insulating layer 16 and the seventh insulating layer 17 which are stacked.

Figure 14:
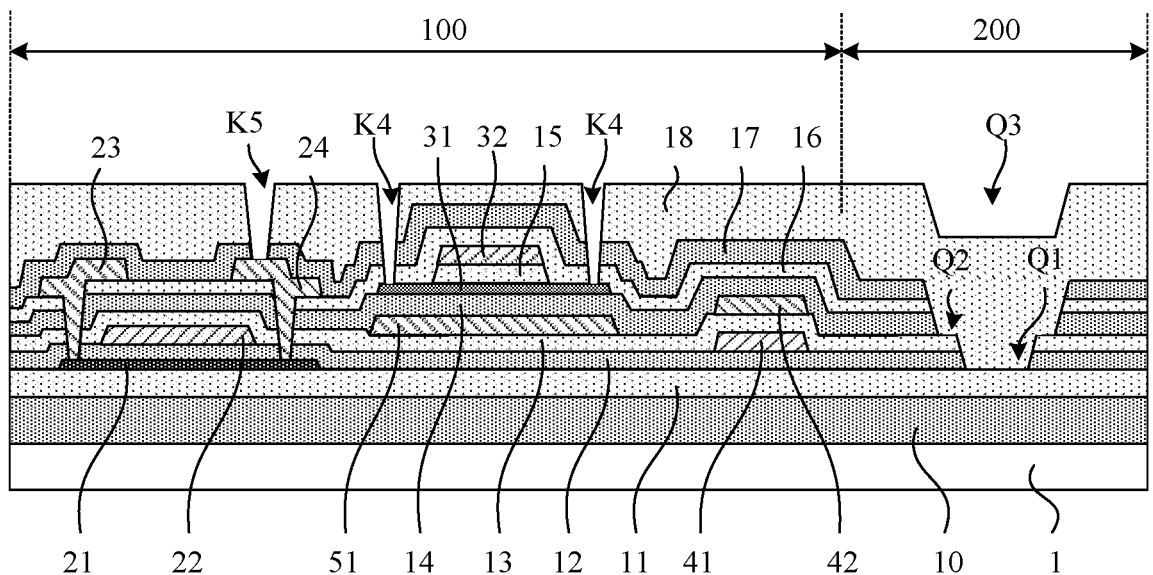
FIG. 14 is a schematic diagram of a display substrate after a pattern of a second active via is formed according to an exemplary embodiment of the present disclosure.

(10) A pattern of a first planarization layer is formed. In an exemplary embodiment, forming of the pattern of the first planarization layer may include: coating a first planarization thin film on the substrate on which the aforementioned patterns are formed, patterning the first planarization thin film through a patterning process to form a first planarization layer 18 on which a fourth via K4, a fifth via K5 and a third groove Q3 are provided, as shown in FIG. 14.

In an exemplary embodiment, in the bonding region 200, the first planarization layer 18 completely fills the first groove Q1 and the second groove Q2. The third groove Q3 is formed on the first planarization layer 18 of the bonding region 200, and a position of the third groove Q3 corresponds to a position of the second groove Q2.

In an exemplary embodiment, the fifth via K5 is formed at a position of the third via K3 in the display region 100, and the first planarization layer 18 in the fifth via K5 is removed to communicate with the third via K3, so that the fifth via K5 exposes a surface of the first drain electrode 24. In an exemplary embodiment, the fifth via K5 is referred to as a connection electrode via.

In an exemplary embodiment, two fourth vias K4 are formed at the positions of two second vias K2 in the display region 100. The first planarization layer 18 in the fourth vias K4 is removed and communicated with the second via K2. By continuing etching, the remaining thickness of the sixth insulating layer 16 in the second via K2 of the semi-open structure is etched away, so that the second via K2 and the fourth via K4 which are communicated expose a surface of the second active layer 31.

In an exemplary embodiment, after coating the first planarization thin film, a cured first planarization layer is formed by a curing and annealing (about 230° C.) process, and then the cured first planarization layer is patterned by using a mask. After the fourth via communicated to the second via is formed, the first planarization layer is used as a hard mask, to etch the remaining sixth insulating layer in the second via continuously, and to form a complete second active via exposing the second active layer, wherein the second active via includes a second via and a fourth via.

It can be seen from the above preparation process that the second active via is formed by two patterning processes in the exemplary embodiment of the present disclosure. In the eighth patterning process of forming the seventh insulating layer, the second via provided is a semi-opening. Only a part of the depth of the via is etched, and the second active layer is still covered by the insulating layer. Therefore, the curing and annealing process of the planarization layer will not deoxidize and conduct the second active layer, thus avoiding the performance deterioration of the second transistor. In the patterning process for forming the first planarization layer, the cured and annealed first planarization layer is used as a hard mask, and the provided fourth via not only communicates with the second via, but also etches the remaining depth of the second via to form a complete second active via exposing the second active layer. The electrical characteristics of the second active layer are not affected by the process, and the performance deterioration of the second transistor is effectively avoided.

In an exemplary embodiment, this patterning process is referred to as a ninth patterning process. After this patterning process, the bonding structure layer of the bonding region 200 includes the substrate 10 disposed on the glass carrier plate 1, and the first insulating layer 11, the first composite insulating layer, the second composite insulating layer and the first planarization layer 18 which are sequentially stacked on the substrate 10. The first groove Q1 is formed on the first composite insulating layer, the second groove Q2 is formed on the second composite insulating layer, and the third groove Q3 is formed on the first planarization layer 18.

In an exemplary embodiment, the mask used in the ninth patterning process and the mask used in the eighth patterning process may be the same mask. In other words, an orthographic projection of the fourth via K4 on the substrate overlaps with an orthographic projection of the second via K2 on the substrate; an orthographic projection of the fifth via K5 on the substrate overlaps with an orthographic projection of the third via K3 on the substrate; and an orthographic projection of the third groove Q3 on the substrate overlaps with the orthographic projection of the second groove Q2 on the substrate, which reduces the number of masks and thereby reduces the production costs.

Figure 15:
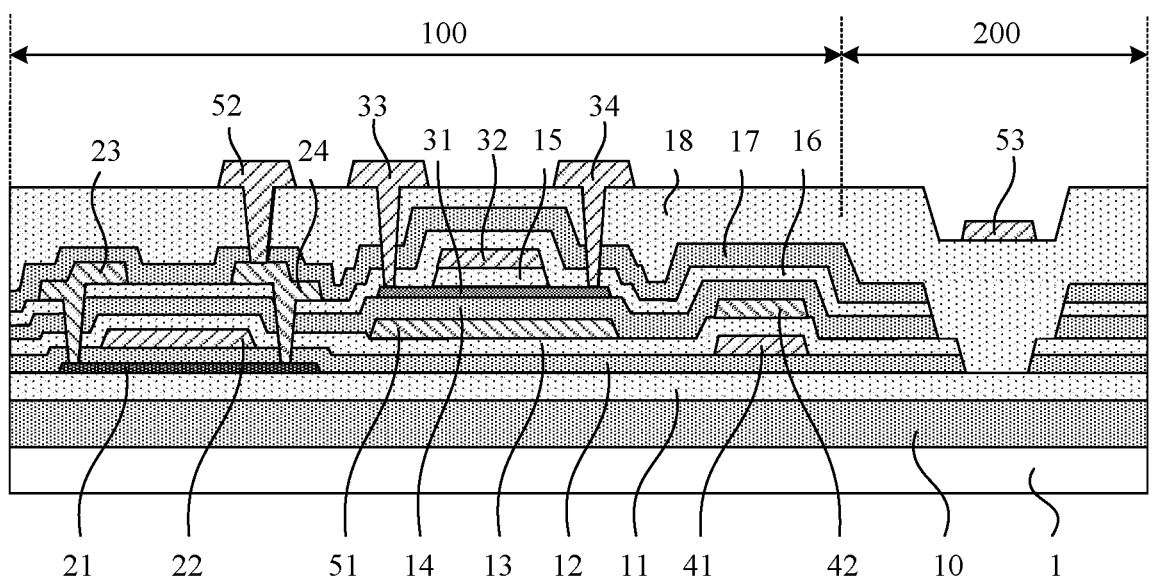
FIG. 15 is a schematic diagram of a display substrate after a pattern of a fifth metal layer is formed according to an exemplary embodiment of the present disclosure.

(11) A pattern of a fifth metal layer is formed. In an exemplary embodiment, forming of the pattern of the fifth metal layer may include: depositing a fifth metal thin film on the substrate on which the aforementioned patterns are formed, patterning the fifth metal thin film through a patterning process to form the pattern of the fifth metal layer on the first planarization layer 18. The pattern of the fifth metal layer at least includes a second source electrode 33, a second drain electrode 34, a connection electrode 52 and a connection line 53, as shown in FIG. 15.

In an exemplary embodiment, the second source electrode 33 and the second drain electrode 34 are formed in the display region 100, and both are connected to the second active layer 31 through the second active via. The second source electrode 33 and the second drain electrode 34 overlap with a surface of the second active layer 31 away from the substrate, forming a front contact connection mode.

In an exemplary embodiment, the connection electrode 52 is formed in the display region 100, and is connected to the first drain electrode 24 through the communicated third via K3 and fifth via K5.

In an exemplary embodiment, the connection line 53 is formed in the bonding region 200, and the connection line 53 is disposed on the first planarization layer 18 in the third groove Q3.

In an exemplary embodiment, this patterning process is referred to as a tenth patterning process. After this patterning process, the bonding structure layer of the bonding region 200 includes the substrate 10 disposed on the glass carrier plate 1, the first insulating layer 11, the first composite insulating layer, the second composite insulating layer, the first planarization layer 18 and the connection line 53 which are sequentially stacked on the substrate 10. The first groove Q1 is formed on the first composite insulating layer, and the second groove Q2 is formed on the second composite insulating layer. The first planarization layer 18 completely fills the first groove Q1 and the second groove Q2. The third groove Q3 is formed on the first planarization layer 18, and the connection line 53 is disposed in the third groove Q3.

In an exemplary embodiment, the fifth metal layer may have a thickness of about 7000 Å to 9000 Å. In some possible implementations, the fifth metal layer may have a thickness of about 7200 Å.

Figure 16:
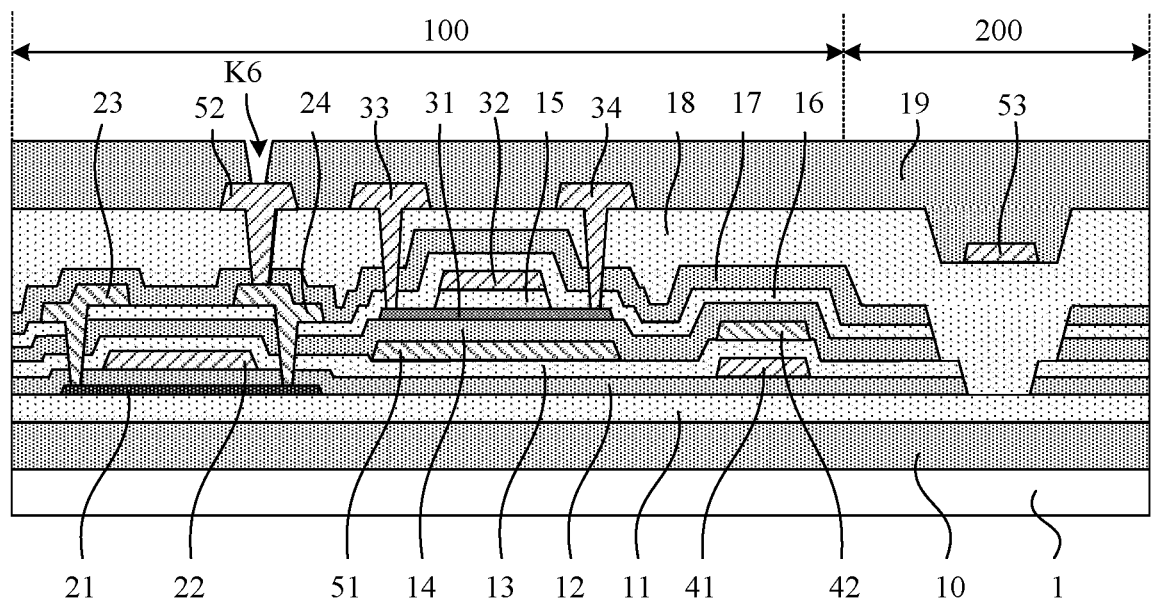
FIG. 16 is a schematic diagram of a display substrate after a pattern of a second planarization layer is formed according to an exemplary embodiment of the present disclosure.

(12) A pattern of a second planarization layer is formed. In an exemplary embodiment, forming of the pattern of the second planarization layer may include: coating a second planarization thin film on the substrate on which the aforementioned patterns are formed, patterning the second planarization thin film through a patterning process to form the pattern of the second planarization layer 19 covering the pattern of the fifth metal layer. The second planarization layer 19 is provided with a sixth via K6, which is formed at a position of the connection electrode 52 in the display region 100, and the second planarization layer 19 in the sixth via K6 is removed, to expose a surface of the connection electrode 52, as shown in FIG. 16. In an exemplary embodiment, the sixth via K6 is referred to as an anode via.

In an exemplary embodiment, this patterning process is referred to as the eleventh patterning process. After this patterning process, the bonding structure layer of the bonding region 200 includes the substrate 10 disposed on the glass carrier plate 1, the first insulating layer 11, the first composite insulating layer, the second composite insulating layer, the first planarization layer 18, the connection line 53 and the second planarization layer 19 which are sequentially stacked on the substrate 10. The first groove Q1 is formed on the first composite insulating layer, and the second groove Q2 is formed on the second composite insulating layer, the first planarization layer 18 completely fills the first groove Q1 and the second groove Q2. The third groove Q3 is formed on the first planarization layer 18, the connection line 53 is disposed in the third groove Q3, and the second planarization layer 19 completely fills the third groove Q3 and covers the connection line 53.

Figure 17:
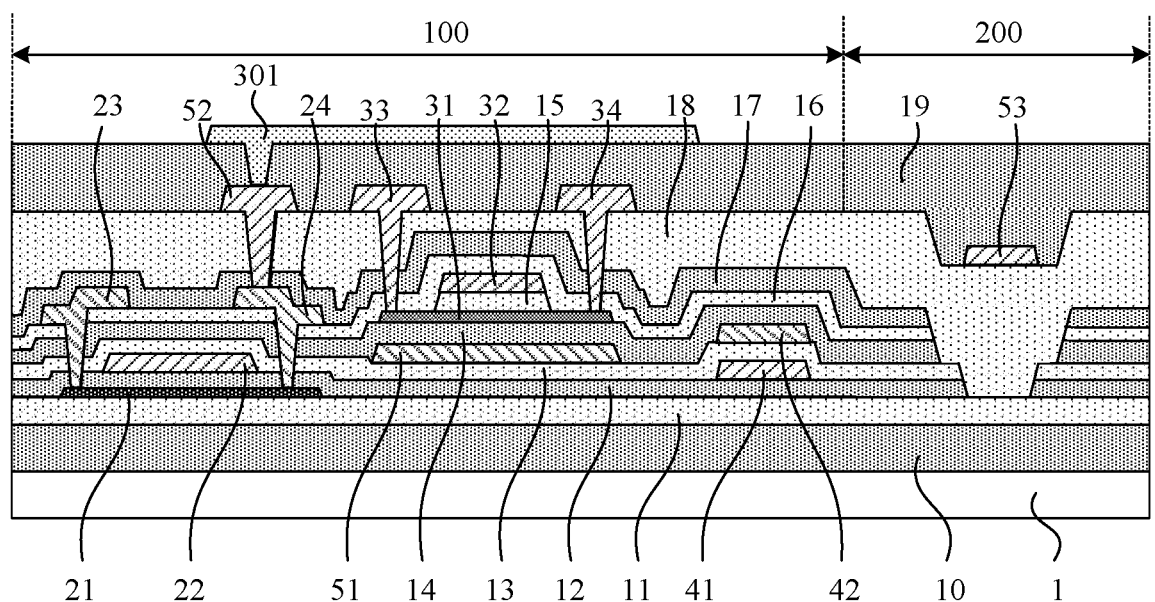
FIG. 17 is a schematic diagram of a display substrate after a pattern of an anode is formed according to an exemplary embodiment of the present disclosure.

(13) A pattern of an anode is formed. In an exemplary embodiment, forming of the pattern of the anode may include: depositing a conductive thin film on the substrate on which the aforementioned patterns are formed, patterning the conductive thin film through a patterning process to form the pattern of an anode 301 on the second planarization layer 19. The anode 301 is formed in the display region 100, and the anode 301 is connected to the connection electrode 52 through the sixth via K6, as shown in FIG. 17.

In an exemplary embodiment, this patterning process is referred to as a twelfth patterning process, and the bonding structure layer of the bonding region 200 has the same structure as that after the eleventh patterning process.

Figure 18:
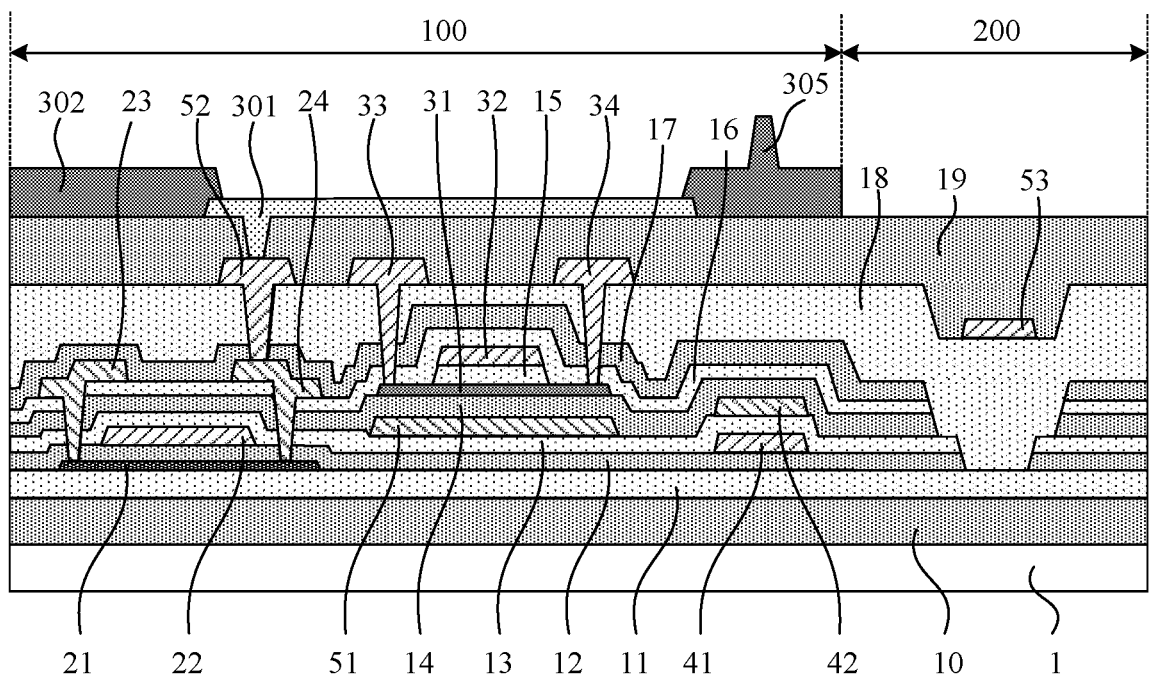
FIG. 18 is a schematic diagram of a display substrate after a pattern of a pixel define layer is formed according to an exemplary embodiment of the present disclosure.

(14) A pixel define pattern is formed. In an exemplary embodiment, forming of the pixel define pattern may include: coating a pixel define thin film on the substrate on which the aforementioned patterns are formed, patterning the pixel define thin film through a patterning process to form the pixel define pattern, which is formed in the display region 100 and at least includes a pixel define layer (PDL) 302 and pillar spacer (PS) 305, as shown in FIG. 18.

In an exemplary embodiment, the pixel define layer 302 is provided with a pixel opening, the pixel define thin film in the pixel opening is developed to expose a surface of the anode 301, and the pillar spacer 305 is disposed on the pixel define layer 302.

In an exemplary embodiment, the pixel define layer 302 and the pillar spacer 305 may be formed by a one-time patterning process using a gray tone mask.

In an exemplary embodiment, this patterning process is referred to as a thirteenth patterning process, and the bonding structure layer of the bonding region 200 has the same structure as that after the eleventh patterning process.

In an exemplary embodiment, the subsequent preparation process may include: sequentially forming an organic light-emitting layer, a cathode, and an encapsulation layer on the substrate on which the aforementioned patterns are formed. The organic light-emitting layer is connected to the anode through the pixel opening, and the cathode is disposed on the organic light-emitting layer and is connected to the organic light-emitting layer. Since the anode is connected to the connection electrode, and the connection electrode is connected to the first drain electrode, a connection between the organic light-emitting layer and the first drain electrode is thereby achieved.

In an exemplary embodiment, the organic light-emitting layer may include a hole injection layer (HIL), a hole transport layer (HTL), an electron bock layer (EBL), a light-emitting layer (EML), a hole block layer (HBL), an electron transport layer (ETL) and an electron injection layer (EIL). In an exemplary embodiment, the hole injection layers of all sub-pixels may be a common layer connected together; the hole transport layers of all sub-pixels may be a common layer connected together; the light-emitting layers of adjacent sub-pixels may be slightly overlapped or isolated; and the hole block layers may be a common layer connected together.

In an exemplary embodiment, the encapsulation layer may include a laminated structure of a first encapsulation layer, a second encapsulation layer and a third encapsulation layer, wherein the first encapsulation layer is made of inorganic materials, the second encapsulation layer is made of organic materials, and the third encapsulation layer is made of inorganic materials to form an inorganic material/organic material/inorganic material laminated structure, and the organic material layer is disposed between the two inorganic material layers, which may prevent external water vapor from entering the light-emitting structure layer. In an exemplary embodiment, a first encapsulation layer may have a thickness of about 800 nm to 1200 nm, a second encapsulation layer may have a thickness of about 100000 nm to 150000 nm, and a third encapsulation layer may have a thickness of about 800 nm to 1200 nm.

In an exemplary embodiment, a preparation process of the display substrate may further include stripping the display substrate from the glass carrier plate 1 by a stripping process, attaching a back film to a back surface of the display substrate (a surface of the substrate 10 away from the film layer) by a roller bonding mode, performing a cutting by a cutting device, and the like, which are not limited in the exemplary embodiments of the present disclosure.

In an exemplary embodiment, the first, second, third, fourth, fifth, sixth, and seventh insulating layers may be made of any one or more of silicon oxide (SiOx), silicon nitride (SiNx) and silicon oxynitride (SiON), and may be single layers, multiple layers or composite layers. The first insulating layer is referred to as a buffer layer to improve the water and oxygen resistance capability of the substrate, the second insulating layer, third insulating layer and the fifth insulating layer are referred to as gate insulating (GI) layers, the fourth insulating layer and the sixth insulating layer are referred to as an interlayer insulating (ILD) layer, and the seventh insulating layer is referred to as a passivation (PVX) layer. The first, second, third, fourth and fifth metal thin films may be made of metal materials, such as any one or more of silver (Ag), copper (Cu), aluminum (Al), titanium (Ti) and molybdenum (Mo), or alloy materials of the above metals, such as aluminum neodymium alloy (AlNd) or molybdenum niobium alloy (MoNb), and may have a single-layer structure or a multi-layer composite structure, such as Ti/Al/Ti. The conductive thin film may be made of a single transparent conductive material, such as indium tin oxide (ITO) or indium zinc oxide (IZO), or a composite metal material and transparent conductive material, such as Ag/ITO, Ag/IZO or ITO/Ag/ITO. Polyimide, acrylic, polyethylene terephthalate or the like may be used for the pixel define layer. The cathode may be made of any one or more of magnesium (Mg), silver (Ag), aluminum (Al), copper (Cu) and lithium (Li), or an alloy made of any one or more of the above metals.

In the display substrate formed by the above process, the first active layer 21, the first gate electrode 22, the first source electrode 23 and the first drain electrode 24 constitute a first transistor which is a low temperature polysilicon thin film transistor. The second active layer 31, the second gate electrode 32, the second source electrode 33 and the second drain electrode 34 constitute a second transistor which is an oxide thin film transistor. The first capacitor electrode and the second capacitor electrode constitute a storage capacitor, and the storage capacitor may compensate a threshold voltage of a drive transistor in the pixel drive circuit. In an exemplary embodiment, the first transistor may be a drive transistor in a pixel drive circuit, and the second transistor may be a switch transistor in the pixel drive circuit.

A display substrate with a traditional structure is formed by 14 patterning processes, includes a first drain-source electrode and a second drain-source electrode disposed on the same layer and formed by the same patterning process. The preparation process of the display substrate includes the following of: (1) forming a first insulating layer and a LTPS active layer on a substrate; (2) forming a second insulating layer and a first gate electrode; (3) forming a third insulating layer and a shield layer; (4) forming a fourth insulating layer and an oxide active layer; (5) forming a fifth insulating layer and a second gate electrode; (6) forming a sixth insulating layer, on which a low temperature polysilicon (CNT-L) via that exposes the LTPS active layer is formed; (7) forming an oxide (CNT-O) via exposing the oxide active layer on the sixth insulating layer; (8) forming a first drain-source electrode and a second drain-source electrode; (9) forming a seventh insulating layer, on which a via exposing the first drain electrode is formed; (10) forming a first planarization layer, on which a via exposing the first drain electrode is formed; (11) forming a connection electrode; (12) forming a second planarization layer, on which a via exposing the connection electrode is formed; (13) forming an anode; (14) forming a pixel define layer and a pillar spacer. In this preparation process, since the CNT-L via that connects the first source-drain electrode to the LTPS active layer has a deeper depth, and the CNT-O via that connects the second source-drain electrode to the oxide active layer has a shallower depth, a depth difference between the CNT-L via and the CNT-O via is rather large, which requires high synchronous etching process, the process is more difficult. Therefore, different patterning processes are used to form different CNT-L vias and CNT-O vias, which not only has a large number of patterning processes and high production costs, but also leads to poor transistor performance. For different vias formed by different patterning processes, whether CNT-L vias are formed before or after CNT-O vias, both processes will have the problem of poor transistor performance. For example, in a process of forming a CNT-L via before forming a CNT-O via, the low temperature polysilicon exposed in the CNT-L via will be oxidized. Therefore, it is necessary to set a cleaning process after forming the CNT-O vias, and use the buffered oxide etch (BOE) to clean the low temperature polysilicon in the CNT-L vias. However, the buffer oxide etch will etch the oxide exposed in the CNT-O vias, which will increase a contact resistance between the second drain-source electrode and the oxide active layer. As a result, the uniformity of the threshold voltages (Vth) and the on-currents (Ion) of the two transistors is deteriorated. For another example, in a process of forming a CNT-O via before forming a CNT-L via, the high temperature annealing (about 450° C.) process of the low temperature polysilicon active layer will deoxidize and conduct the oxide exposed in the CNT-O via. As a result, the performance of the second transistor is deteriorated, and the uniformity of the threshold voltages and the on-currents of the two transistors is also deteriorated.

In the display substrate provided by the exemplary embodiment of the present disclosure, the CNT-O via is provided after the first drain-source electrode is formed. Therefore, the high-temperature annealing process of the low temperature polysilicon does not deoxidize and conduct the second active layer, and the cleaning process of low temperature polysilicon will not damage the second active layer, thus ensuring the overlapping quality between the second drain-source electrodes and the second source electrodes. This not only avoids the performance deterioration of the second transistor, but also ensures the uniformity of threshold voltage and on-current of low temperature polysilicon thin film transistors and oxide thin film transistors, improving the yield as well as the display effect.

According to the display substrate provided by the exemplary embodiment of the present disclosure, CNT-O vias are opened by two patterning processes, and in the eighth patterning process for forming the seventh insulating layer, partial deep etching of the CNT-O vias (i.e., the CNT-O vias are half open) is realized, so that the subsequent curing annealing (about 230° C.) process of the planarization layer will not deoxidize and conduct the second active layer, thus avoiding the performance deterioration of the second transistor. In the ninth patterning process for forming the first planarization layer, the cured and annealed first planarization layer is used as a hard mask to etch the remaining depth of the CNT-O via, forming a complete CNT-O via exposing the second active layer, and realizing the connection between the second drain-source electrode and the second active layer. This not only avoids the performance deterioration of the second transistor, but also ensures the uniformity of threshold voltages and on-currents of low temperature polysilicon thin film transistors and oxide thin film transistors, improving the yield.

The display substrate provided by the exemplary embodiment of the disclosure not only greatly reduces the process difficulty and process requirements, but also simplifies the process, reduces the number of patterning processes and saves the production cost through a reasonable process flow. The exemplary embodiment of the present disclosure shows that the preparation process of the display substrate has simple process and good process compatibility, which is beneficial to ensuring the uniformity of the two transistors, improving the yield and reducing the production cost.

The structure shown in the present disclosure and the preparation process thereof are merely an exemplary description. In an exemplary implementation, corresponding structures may be changed and patterning processes may be added or reduced according to actual needs. For example, the materials of the first active layer may include oxide, and the materials of the second active layer may include low temperature polysilicon. For another example, the OLED display substrate may have a top emission structure, or may have a bottom emission structure. The transistor may have a top gate structure, a bottom gate structure, or a single gate structure, or a dual gate structure. In a further example, other electrodes or leads may also be disposed in relevant film layers, which is not specifically limited here in the exemplary embodiment of the present disclosure.

An exemplary embodiment of the present disclosure further provides a preparation method of a display substrate. In an exemplary embodiment, the preparation method includes: step S1, step S2, and step S3.

Step S1 includes forming an active structure layer on a substrate. The active structure layer includes a first active layer and a second active layer.

Step S2 includes forming a first source-drain structure layer on the active structure layer. The first source-drain structure layer includes a first active via and a first source-drain electrode, and the first source-drain electrode is connected to the first active layer through the first active via.

Step S3 includes forming a second source-drain structure layer on the first source-drain structure layer. The second source-drain structure layer includes a second active via and a second source-drain electrode, and the second source-drain electrode is connected to the second active layer through the second active via.

In an exemplary embodiment, step S1 may include:

sequentially forming a first insulating layer, the first active layer, a second insulating layer, a first gate electrode, a third insulating layer, a shield layer, a fourth insulating layer and the second active layer on a substrate; and forming a fifth insulating layer disposed on the second active layer and a second gate electrode disposed on the fifth insulating layer.

In an exemplary embodiment, step S2 may include: forming a sixth insulating layer covering the active structure layer, a first active via is formed on a second insulating layer, a third insulating layer, a fourth insulating layer and a sixth insulating layer; and forming a first source electrode and a first drain electrode on the sixth insulating layer, and the first source electrode and the first drain electrode are both connected to the first active layer through the first active via.

In an exemplary embodiment, after forming the first active via, the method further includes: annealing and/or cleaning the first active layer exposed in the first active via.

In an exemplary embodiment, step S3 may include: forming a seventh insulating layer covering the first source-drain structure layer, a second via is formed on the seventh insulating layer, and an insulating layer covering the second active layer is reserved in the second via;

forming a first planarization layer on the seventh insulating layer, forming a fourth via communicated to the second via on the first planarization layer, and etching the insulating layer in the second via to form a second active via; and forming a second source electrode and a second drain electrode on the seventh insulating layer, and the second source electrode and the second drain electrode are both connected to the second active layer through the second active via.

In an exemplary embodiment, forming a first planarization layer on the seventh insulating layer includes:

coating a planarization thin film on the seventh insulating layer;

forming a first planarization layer through a curing annealing process;

forming a fourth via communicated to the second via through a patterning process; and etching the insulating layer in the second via by using the first planarization layer as a mask to form a complete second active via exposing the second active layer.

In an exemplary embodiment, a material of the first active layer includes low temperature polysilicon, and a material of the second active layer includes oxide; or, a material of the first active layer includes oxide, and a material of the second active layer includes low temperature polysilicon.

An exemplary embodiment of the present disclosure provides a preparation method of a display substrate. A second active via is provided after the first drain-source electrode is formed. Therefore, the high-temperature annealing process of the low temperature polysilicon does not deoxidize and conduct the second active layer, and the cleaning process of low temperature polysilicon will not damage the second active layer, thus ensuring the overlapping quality between the second drain-source electrodes and the second source electrodes. This not only avoids the performance deterioration of the second transistor, but also ensures the uniformity of threshold voltages and on-currents of low temperature polysilicon thin film transistors and oxide thin film transistors, improving the yield. The exemplary embodiment of the present disclosure shows that the preparation method of the display substrate not only greatly reduces the process difficulty and process requirements, but also simplifies the process, reduces the number of patterning processes and saves the production cost through a reasonable process flow. The exemplary embodiment of the present disclosure shows that the preparation process of the display substrate has simple process and good process compatibility, which is beneficial to ensuring the uniformity of the two transistors, improving the yield and reducing the production cost.

An exemplary embodiment of the present disclosure further provides a display apparatus which includes any display substrate of the aforementioned embodiments. The display apparatus may be any product or component with a display function such as a mobile phone, a tablet computer, a television, a monitor, a laptop, a digital frame, or a navigator, etc.

Although the embodiments disclosed in the present disclosure are as described above, the embodiments described in the above contents are only for the present disclosure to be understood easily, not for limiting the present disclosure. Any person skilled in the art to which the present disclosure pertains may make any modifications and variations in the form and details of implementation without departing from the essence and scope of the present disclosure. Nevertheless, the protection scope of the present disclosure shall still be determined by the scope defined by the appended claims.

What is claimed is:

1. A display substrate, comprising: a substrate, an active structure layer disposed on the substrate, a first source-drain structure layer disposed on a side of the active structure layer away from the substrate, and a second source-drain structure layer disposed on a side of the first source-drain structure layer away from the substrate; wherein
the active structure layer comprises a first active layer and a second active layer;
the first source-drain structure layer comprises a first active via and a first source-drain electrode, and the first source-drain electrode is connected to the first active layer through the first active via; and
the second source-drain structure layer comprises a second active via and a second source-drain electrode, and the second source-drain electrode is connected to the second active layer through the second active via;
wherein the second source-drain structure layer comprises:
a seventh insulating layer covering the first source-drain structure layer, wherein a second via is formed on the seventh insulating layer, and an insulating layer covering the second active layer is reserved in the second via;
a first planarization layer disposed on a side of the seventh insulating layer away from the substrate, wherein after a fourth via is formed communicated to the second via on the first planarization layer, the insulating layer in the second via is etched to form the second active via
a second source electrode and a second drain electrode disposed on a side of the seventh insulating layer away from the substrate; wherein the second source electrode and the second drain electrode are both connected to the second active layer through the second active via.

2. The display substrate according to claim 1, wherein a material of the first active layer comprises low temperature polysilicon, and a material of the second active layer comprises oxide.

3. The display substrate according to claim 1, wherein a material of the first active layer comprises oxide, and a material of the second active layer comprises low temperature polysilicon.

4. The display substrate according to claim 1, wherein the active structure layer comprises:
a first insulating layer disposed on the substrate,
a first active layer disposed on a side of the first insulating layer away from the substrate,
a second insulating layer covering the first active layer,
a first gate electrode disposed on a side of the second insulating layer away from the substrate,
a third insulating layer covering the first gate electrode,
a light shield layer disposed on a side of the third insulating layer away from the substrate,
a fourth insulating layer covering the light shield layer,
a second active layer disposed on a side of the fourth insulating layer away from the substrate,
a fifth insulating layer disposed on a side of the second active layer away from the substrate, and
a second gate electrode disposed on a side of the fifth insulating layer away from the substrate.

5. The display substrate according to claim 4, wherein the first source-drain structure layer comprises a sixth insulating layer covering the active structure layer, and
a first source electrode and a first drain electrode disposed on a side of the sixth insulating layer away from the substrate; and
the first active via is formed on the second insulating layer, the third insulating layer, the fourth insulating layer and the sixth insulating layer, and the first source electrode and the first drain electrode are both connected to the first active layer through the first active via.

6. The display substrate according to claim 4, wherein the second source-drain structure layer comprises:
a seventh insulating layer covering the first source-drain structure layer,
a first planarization layer disposed on a side of the seventh insulating layer away from the substrate, and
a second source electrode and a second drain electrode disposed on a side of the seventh insulating layer away from the substrate; and
the second active via is formed on the sixth insulating layer, the seventh insulating layer and the first planarization layer, and the second source electrode and the second drain electrode are both connected to the second active layer through the second active via.

7. The display substrate according to claim 6, wherein the second active via comprises a via formed on the seventh insulating layer by one patterning process and a via formed on the first planarization layer and the sixth insulating layer by another patterning process.

8. The display substrate according to claim 6, wherein the second source-drain structure layer further comprises a connection electrode connected to the first source-drain electrode through a connection electrode via, and the connection electrode is disposed in a same layer as the second source electrode and the second drain electrode.

9. The display substrate according to claim 8, further comprising a second planarization layer disposed on the second source-drain structure layer and an anode disposed on the second planarization layer, wherein the anode is connected to the connection electrode through an anode via.

10. A display apparatus, comprising a display substrate, the display substrate comprising: a substrate, an active structure layer disposed on the substrate, a first source-drain structure layer disposed on a side of the active structure layer away from the substrate, and a second source-drain structure layer disposed on a side of the first source-drain structure layer away from the substrate; wherein
the active structure layer comprises a first active layer and a second active layer;
the first source-drain structure layer comprises a first active via and a first source-drain electrode, and the first source-drain electrode is connected to the first active layer through the first active via;
the second source-drain structure layer comprises a second active via and a second source-drain electrode, and the second source-drain electrode is connected to the second active layer through the second active via;
wherein the second source-drain structure layer comprises:
a seventh insulating layer covering the first source-drain structure layer, wherein a second via is formed on the seventh insulating layer, and an insulating layer covering the second active layer is reserved in the second via;
a first planarization layer disposed on a side of the seventh insulating layer away from the substrate, wherein after a fourth via is formed communicated to the second via on the first planarization layer, the insulating layer in the second via is etched to form the second active via
a second source electrode and a second drain electrode disposed on a side of the seventh insulating layer away from the substrate; wherein the second source electrode and the second drain electrode are both connected to the second active layer through the second active via.

11. The display apparatus according to claim 10, wherein the active structure layer comprises:
a first insulating layer disposed on the substrate,
a first active layer disposed on a side of the first insulating layer away from the substrate,
a second insulating layer covering the first active layer,
a first gate electrode disposed on a side of the second insulating layer away from the substrate,
a third insulating layer covering the first gate electrode,
a light shield layer disposed on a side of the third insulating layer away from the substrate,
a fourth insulating layer covering the light shield layer,
a second active layer disposed on a side of the fourth insulating layer away from the substrate,
a fifth insulating layer disposed on a side of the second active layer away from the substrate, and
a second gate electrode disposed on a side of the fifth insulating layer away from the substrate.

12. The display apparatus according to claim 11, wherein the first source-drain structure layer comprises
a sixth insulating layer covering the active structure layer, and
a first source electrode and a first drain electrode disposed on a side of the sixth insulating layer away from the substrate;
the first active via is formed on the second insulating layer, the third insulating layer, the fourth insulating layer and the sixth insulating layer, and the first source electrode and the first drain electrode are both connected to the first active layer through the first active via.

13. A preparation method of a display substrate, comprising:
forming an active structure layer on a substrate, wherein the active structure layer comprises a first active layer and a second active layer;
forming a first source-drain structure layer on the active structure layer, wherein the first source-drain structure layer comprises a first active via and a first source-drain electrode, and the first source-drain electrode is connected to the first active layer through the first active via; and
forming a second source-drain structure layer on the first source-drain structure layer, wherein the second source-drain structure layer comprises a second active via and a second source-drain electrode, and the second source-drain electrode is connected to the second active layer through the second active via;
wherein the forming a second source-drain structure layer on the first source-drain structure layer comprises:
forming a seventh insulating layer covering the first source-drain structure layer, wherein a second via is formed on the seventh insulating layer, and an insulating layer covering the second active layer is reserved in the second via;
forming a first planarization layer on the seventh insulating layer, and after forming a fourth via communicated to the second via on the first planarization layer, etching the insulating layer in the second via to form the second active via; and
forming a second source electrode and a second drain electrode on the seventh insulating layer, and the second source electrode and the second drain electrode are both connected to the second active layer through the second active via.

14. The preparation method according to claim 13, wherein the forming an active structure layer on the substrate comprises:
sequentially forming a first insulating layer, the first active layer, a second insulating layer, a first gate electrode, a third insulating layer, a shield layer, a fourth insulating layer and the second active layer on the substrate; and
forming a fifth insulating layer disposed on the second active layer and a second gate electrode disposed on the fifth insulating layer.

15. The preparation method of claim 13, wherein, the forming a first planarization layer on the seventh insulating layer comprises:
coating a planarization thin film on the seventh insulating layer;
forming the first planarization layer through a curing annealing process;
forming the fourth via communicated to the second via through a patterning process; and
etching the insulating layer in the second via by using the first planarization layer as a mask to form a complete second active via exposing the second active layer.

16. The preparation method according to claim 13, wherein a material of the first active layer comprises low temperature polysilicon, and a material of the second active layer comprises oxide; or, a material of the first active layer comprises oxide, and a material of the second active layer comprises low temperature polysilicon.

17. The preparation method according to claim 13, wherein the forming a first source-drain structure layer on the active structure layer comprises:
forming a sixth insulating layer covering the active structure layer, wherein the first active via is formed on the second insulating layer, the third insulating layer, the fourth insulating layer and the sixth insulating layer; and
forming a first source electrode and a first drain electrode on the sixth insulating layer, wherein the first source electrode and the first drain electrode are both connected to the first active layer through the first active via.

18. The preparation method according to claim 17, wherein after the forming the first active via, the method further comprises: annealing and/or cleaning the first active layer exposed in the first active via.

* * * * *